(12) United States Patent
Ispas et al.

(10) Patent No.: US 11,047,897 B2
(45) Date of Patent: Jun. 29, 2021

(54) SIGNAL ANALYSIS METHOD AND MEASUREMENT INSTRUMENT

(71) Applicant: Rohde & Schwarz GmbH & Co. KG, Munich (DE)

(72) Inventors: Adrian Ispas, Munich (DE); Julian Leyh, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/992,676

(22) Filed: Aug. 13, 2020

(65) Prior Publication Data

US 2021/0018548 A1 Jan. 21, 2021

Related U.S. Application Data

(63) Continuation-in-part of application No. 16/750,783, filed on Jan. 23, 2020.

(60) Provisional application No. 62/799,326, filed on Jan. 31, 2019, provisional application No. 62/795,931, filed on Jan. 23, 2019.

(51) Int. Cl.
*G01R 29/26* (2006.01)
*G01R 13/02* (2006.01)
*G01R 23/16* (2006.01)

(52) U.S. Cl.
CPC ............. *G01R 29/26* (2013.01); *G01R 13/02* (2013.01); *G01R 23/16* (2013.01)

(58) Field of Classification Search
CPC ....... H04L 1/205; H04L 43/087; H04L 1/203; H04L 41/142; H04L 43/50; H04L 43/0847; G01R 29/26; H04B 14/023; H04B 17/309
See application file for complete search history.

(56) References Cited

U.S. PATENT DOCUMENTS 9,088,399 B1 * 7/2015 Poon ................ G01R 31/31709
9,130,751 B2 9/2015 Zivny et al.
9,363,045 B2 6/2016 Agoston et al.
10,020,967 B1 * 7/2018 Li ........................... H04L 1/205
(Continued)

*Primary Examiner* — Khanh C Tran
(74) *Attorney, Agent, or Firm* — Christensen O'Connor Johnson Kindness PLLC

(57) ABSTRACT

A signal analysis method for determining at least one perturbance component of an input signal is described, wherein the perturbance is associated with at least one of jitter and noise. The signal analysis method includes: receiving and/or generating probability data containing information on a collective probability density function of a random perturbance component of the input signal and an other bounded uncorrelated (OBU) perturbance component of the input signal; determining a standard deviation of the random perturbance component based on the probability data; determining a random perturbance probability density function being associated with the random perturbance component based on the standard deviation; and determining an OBU perturbance probability density function being associated with the OBU perturbance component, wherein the OBU perturbance probability density function is determined based on the probability data and based on the probability density function that is associated with the random perturbance component. Further, a measurement instrument is described.

20 Claims, 11 Drawing Sheets

(56) References Cited

U.S. PATENT DOCUMENTS

| | | | |
|---|---|---|---|
| 2007/0098126 A1* | 5/2007 | Tietz | H04L 1/205 |
| | | | 375/355 |
| 2011/0292987 A1* | 12/2011 | Zivny | G01R 31/31709 |
| | | | 375/226 |
| 2013/0142242 A1* | 6/2013 | Agoston | H04L 1/205 |
| | | | 375/226 |
| 2020/0236017 A1* | 7/2020 | Nitsch | H04L 43/045 |
| 2020/0236018 A1* | 7/2020 | Nitsch | H04L 1/205 |
| 2020/0236019 A1* | 7/2020 | Nitsch | H04L 41/142 |
| 2020/0236020 A1* | 7/2020 | Nitsch | H04L 41/142 |

* cited by examiner

SIGNAL ANALYSIS METHOD AND MEASUREMENT INSTRUMENT

CROSS-REFERENCES TO RELATED APPLICATIONS

This application is a Continuation-in-Part of U.S. application Ser. No. 16/750,783, filed Jan. 23, 2020, which claims the benefit of U.S. Provisional Application No. 62/795,931, filed Jan. 23, 2019, and U.S. Provisional Application No. 62/799,326, filed Jan. 31, 2019, the disclosures of which are incorporated herein in their entirety.

FIELD OF THE DISCLOSURE

Embodiments of the present disclosure generally relate to a signal analysis method for determining at least one perturbance component of an input signal. Embodiments of the present disclosure further relate to a measurement instrument.

BACKGROUND

For jitter analysis, the components of jitter such as Data Dependent Jitter (DDJ), Periodic Jitter (PJ), Other Bounded Uncorrelated Jitter (OBUJ) and Random Jitter (RJ) must be separated and the bit error rate (BER) must be calculated.

So far, techniques are known that exclusively relate on determining the Time Interval Error (TIE) of the Total Jitter (TJ). In some embodiments, the causes of the different jitter types lead to a distortion of the received signal and they, therefore, have an influence on the TIE via the received signal. Accordingly, the respective components of jitter are calculated once the Time Interval Error (TIE) of the Total Jitter (TJ) is determined.

However, it turned out that the measurement time is long if a high accuracy is to be achieved. Put another way, the signal length of the signal to be analyzed is long resulting in a long measuring duration if high precision is aimed for.

Moreover, the respective components of jitter are obtained by averaging operations. For instance, the Data Dependent Jitter (DDJ) is estimated by averaging the Time Interval Error (TIE) of the Total Jitter (TJ), namely the DDJ eye diagram or the DDJ worst case eye diagram. Moreover, certain components of jitter cannot be determined in a reliable manner.

OBU jitter and OBU noise are a measure for the strength of cross talk between a transmission channel transmitting a data signal and other signal channels, wherein the cross talk constitutes an uncorrelated perturbation for the data signal. In the prior art, only a peak-to-peak value of the OBUJ is estimated based on a model of the OBUJ. However, for debugging a device under test, further information about the OBU jitter and the OBU noise would be desirable.

Accordingly, there is a need for a fast and reliable possibility to determine a jitter component or a noise component of an input signal, particularly the Other Bounded Uncorrelated Jitter (OBUJ) and the Other Bounded Uncorrelated Noise (OBUN).

SUMMARY

Embodiments of the present disclosure provide a signal analysis method for determining at least one perturbance component of an input signal, wherein the input signal is generated by a signal source, and wherein the perturbance is associated with at least one of jitter and noise. In an embodiment, the signal analysis method comprises the following steps:

receiving and/or generating probability data containing information on a collective probability density function of a random perturbance component of the input signal and an other bounded uncorrelated (OBU) perturbance component of the input signal;

determining a standard deviation of the random perturbance component based on the probability data;

determining a random perturbance probability density function being associated with the random perturbance component based on the standard deviation; and determining an OBU perturbance probability density function being associated with the OBU perturbance component, wherein the OBU perturbance probability density function is determined based on the probability data and based on the probability density function that is associated with the random perturbance component.

Therein and in the following, the term "perturbance" is used to exclusively denote either jitter or noise.

Thus, the term "perturbance" is used in order to describe only two different sources of perturbations of the input signal that may impair a signal integrity of the input signal, wherein the signal integrity corresponds to a set of measures that describe all kinds of deviations of the input signal from an ideal input signal.

For example, the signal integrity may relate to runts, glitches, duty cycle distortion, slew rate, crosstalk, intersymbol interference, reflections, ripple, and all kinds of noise and jitter.

Accordingly, the signal analysis method(s) may be performed in order to determine an OBUJ probability density function being associated with the other bounded uncorrelated jitter component, and/or in order to determine an OBUN probability density function being associated with the other bounded uncorrelated noise component.

In the following, the term "other bounded uncorrelated perturbance" is abbreviated as "OBUP" for better readability.

The probability density function of the OBUP is determined by first determining the random perturbance component, more precisely the probability density function of the random perturbance, and by then separating the random perturbance component from the OBUP based on the determined probability density function of the random perturbance and on the collective probability density function of the random perturbance and the OBUP. This way, the OBUP component is isolated and information on the OBUP component contained in the input signal is provided at least in the form of the probability density.

Therein and in the following, the "collective probability density function of the random perturbance and the OBUP" is understood to describe the probability density of the sum of the random perturbance and the OBUP on amplitude level. Accordingly, the collective probability density function is a convolution of the individual probability densities of the random perturbance and of the OBUP.

The collective probability density function may be associated only with the random perturbance component and with the other bounded uncorrelated perturbance component. In other words, the collective probability density is free of perturbance components other than random perturbances and OBUP. Thus, the OBUP component or rather the probability density of the OBUP can be determined more precisely as there are no influences from other perturbance components. The remaining perturbance components may be treated and/or analyzed separately from the random perturbances and the OBUP.

Thus, the signal analysis method according to embodiments of the disclosure provides the probability density function of the OBUP rather than only a model-based peak-to-peak value of the OBUP. Accordingly, additional information on the OBUP is provided and may be used for further measurements, for example for debugging a device under test.

As the random perturbance is normal-distributed and has an expected value of zero, the probability density function of the random perturbance is completely determined by the standard deviation and has the form of a normal distribution. Thus, by determining the standard deviation of the random perturbance from the probability data, also the probability density function of the random perturbance is determined.

According to an aspect of the present disclosure, the OBU perturbance probability density function is determined by a deconvolution of the collective probability density function and the random perturbance probability density function. As the collective probability density function of the random perturbance and the OBUP is given by a convolution of the individual probability density functions of the random perturbance and the OBUP, the probability density function of the OBUP can be determined by the deconvolution described above.

According to another aspect of the present disclosure, the deconvolution is performed by at least one of minimizing and maximizing a cost functional, wherein the cost functional depends on the collective probability density function, the determined random perturbance probability density function and the OBU perturbance probability density function to be determined. In other words, the probability density of the OBUP is determined to be the particular function that minimizes or maximizes the cost functional. Whether the cost functional is minimized or maximized depends on the particular definition of the cost functional, as both cases can be converted into one another by a global multiplication of the cost functional with minus one. However, the cost functional may be defined such that the deconvolution is performed by minimizing the cost functional, which can be regarded as the intuitive definition of the cost functional.

In a further embodiment of the present disclosure, the cost functional is at least one of minimized and maximized by a least squares method, for example by a minimum squared error method. Put differently, the probability density of the OBUP is determined by solving an optimization problem, for example a convex optimization problem. Thus, a local optimum automatically constitutes a global optimum.

According to another aspect of the present disclosure, the cost functional is minimized or maximized under at least one side-condition. Generally, the at least one side-condition defines properties that the probability density of the OBUP has to fulfil, e.g. physical properties that are associated with general properties of the OBUP or with general properties of probability density functions.

In some embodiments, the at least one side-condition comprises at least one of a non-negativity of the OBU perturbance probability density function, a defined value for a summed OBU perturbance probability density function, and an unambiguity of the OBU perturbance probability density function. Moreover, the at least one side-condition may comprise a predefined expected value of the OBUP probability density function and/or a predefined standard deviation of the OBUP probability density function.

Therein, the summed OBUP probability density function corresponds to a sum of the individual values of the OBUP probability density function (in the time-discrete case) or to an integral over the OBUP probability density function (in the time-continuous case).

The predefined expected value of the OBUP probability density function may be equal to the expected value of the collective probability density function.

The predefined standard deviation of the OBUP probability density function may be equal to the difference between the standard deviation of the collective probability density function and the standard deviation of the random perturbance probability density function.

According to an aspect of the present disclosure, the standard deviation is determined by a mathematical scale transformation of a cumulative collective probability density function being associated with both the random perturbance component and the OBU perturbance component. It turned out that the slope of the mathematical scale transform of the collective probability density function is inversely proportional to the standard deviation. Thus, the standard deviation may be determined by determining the slope of the mathematical scale transform of the cumulative collective probability density function.

According to another aspect of the present disclosure, the standard deviation of the random perturbance component is determined by at least one of minimizing and maximizing a cost functional, wherein the cost functional depends on a cumulative collective probability density function and the standard deviation of the random perturbance component. Whether the cost functional is minimized or maximized depends on the particular definition of the cost functional, as already described above.

In a further embodiment of the present disclosure, the cost functional is at least one of minimized and maximized by a least squares method. Put differently, the standard deviation of the random perturbance component is determined by solving an optimization problem, for example a convex optimization problem. Thus, a local optimum automatically constitutes a global optimum.

According to a further aspect of the present disclosure, the cost functional is minimized or maximized under at least one side-condition. Generally, the at least one side-condition defines properties, which the cumulative collective probability density function has to fulfil, e.g. physical properties that are associated with general properties of the random perturbances and of the OBUP, or with general properties of (cumulative) probability density functions.

In some embodiments, the at least one side-condition comprises at least one of a non-negativity of the standard deviation of the random perturbance component, and an upper boundary for the standard deviation of the random perturbance component. The upper boundary may be given by the standard deviation of the collective probability density function. This is due to the fact that the random perturbances and the OBUP are statistically independent from each other. Thus, the standard deviation of the combined perturbances (random perturbances plus OBUP) is equal to the sum of the individual standard deviations of the random perturbances and the OBUP.

According to another aspect of the present disclosure, at least one histogram being associated with the OBU perturbance component and at least one further perturbance component is determined based on the determined OBU perturbance probability density function, wherein the at least one further perturbance component is different from the OBU perturbance component and from the random perturbance component. In other words, a combined histogram of the at least one further perturbance component and the OBUP component is determined.

Generally, the combined histogram may be determined by convolving the individual histograms of the OBUP component and of the further perturbance component.

For example, a combined histogram of DDJ and OBUJ, and/or a combined histogram of DDN and OBUN may be determined. As another example, a combined histogram of PJ and OBUJ, and/or a combined histogram of PN and OBUN may be determined.

Moreover, key indicators like peak-to-peak can be derived from the histograms determined as well.

According to a further embodiment of the present disclosure, the input signal is PAM-n coded, wherein n is an integer bigger than 1. Accordingly, the method is not limited to binary signals (PAM-2 coded) since any kind of pulse-amplitude modulated signals may be processed.

Embodiments of the present disclosure further provide a measurement instrument, comprising at least one input channel and an analysis circuit or module being connected to the at least one input channel. In an embodiment, the analysis module is configured to receive and/or generate probability data containing information on a collective probability density function of a random perturbance component of the input signal and an other bounded uncorrelated (OBU) perturbance component of the input signal, wherein the perturbance is associated with at least one of jitter and noise. The analysis module is configured to determine a standard deviation of the random perturbance component based on the probability data. The analysis module is configured to determine a random perturbance probability density function associated with the random perturbance component based on the standard deviation. The analysis module is configured to determine a OBU perturbance probability density function associated with the OBU perturbance component, wherein the OBU perturbance probability density is determined by the analysis module based on the probability data and based on the probability density function associated with the random perturbance component.

In some embodiments, the measurement instrument is configured to perform any one of the signal analysis methods described above.

Regarding the advantages and further properties of the measurement instrument, reference is made to the explanations given above with regard to the signal analysis method, which also hold for the measurement instrument and vice versa.

According to an aspect of the present disclosure, the analysis module is configured to determine the OBU perturbance probability density function by a deconvolution of the collective probability density function and the random perturbance probability density function. As the collective probability density function of the random perturbance and the OBUP is given by a convolution of the individual probability density functions of the random perturbance and the OBUP, the probability density function of the OBUP can be determined by the deconvolution described above.

According to another aspect of the present disclosure, the analysis module is configured to perform the deconvolution by at least one of minimizing and maximizing a cost functional, wherein the cost functional depends on the collective probability density function, the determined random perturbance probability density function and the OBU perturbance probability density function to be determined. In other words, the probability density of the OBUP is determined to be the particular function that minimizes or maximizes the cost functional. Whether the cost functional is minimized or maximized depends on the particular definition of the cost functional, as both cases can be converted into one another by a global multiplication of the cost functional with minus one. However, the cost functional may be defined such that the deconvolution is performed by minimizing the cost functional, which can be regarded as the intuitive definition of the cost functional.

In some embodiments, the analysis module is configured to minimize or maximize the cost functional under at least one side-condition. Generally, the at least one side-condition defines properties that the probability density of the OBUP has to fulfil, e.g. physical properties that are associated with general properties of the OBUP or with general properties of probability density functions.

In some embodiments, the at least one side-condition comprises at least one of a non-negativity of the OBU perturbance probability density function, a defined value for a summed OBU perturbance probability density function, and an unambiguity of the OBU perturbance probability density function. Moreover, the at least one side-condition may comprise a predefined expected value of the OBUP probability density function and/or a predefined standard deviation of the OBUP probability density function.

According to another aspect of the present disclosure, the analysis module is configured to determine the standard deviation of the random perturbance component by at least one of minimizing and maximizing a cost functional, wherein the cost functional depends on a cumulative collective probability density function and the standard deviation of the random perturbance component. Whether the cost functional is minimized or maximized depends on the particular definition of the cost functional, as already described above.

According to a further embodiment of the present disclosure, the analysis module is configured to minimize or maximize the cost functional under at least one side-condition. Generally, the at least one side-condition defines properties, which the cumulative collective probability density function has to fulfil, e.g. physical properties that are associated with general properties of the random perturbances and of the OBUP, or with general properties of (cumulative) probability density functions.

In some embodiments, the at least one side-condition comprises at least one of a non-negativity of the standard deviation of the random perturbance component, and an upper boundary for the standard deviation of the random perturbance component. The upper boundary may be given by the standard deviation of the collective probability density function. This is due to the fact that the random perturbances and the OBUP are statistically independent from each other. Thus, the standard deviation of the combined perturbances (random perturbances plus OBUP) is equal to the sum of the individual standard deviations of the random perturbances and the OBUP.

According to another aspect of the present disclosure, the measurement instrument is established as at least one of an oscilloscope, a spectrum analyzer and a vector network analyzer. Thus, an oscilloscope, a spectrum analyzer and/or a vector network analyser may be provided that is enabled to perform the signal analysis methods described above for determining at least one perturbance component of an input signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
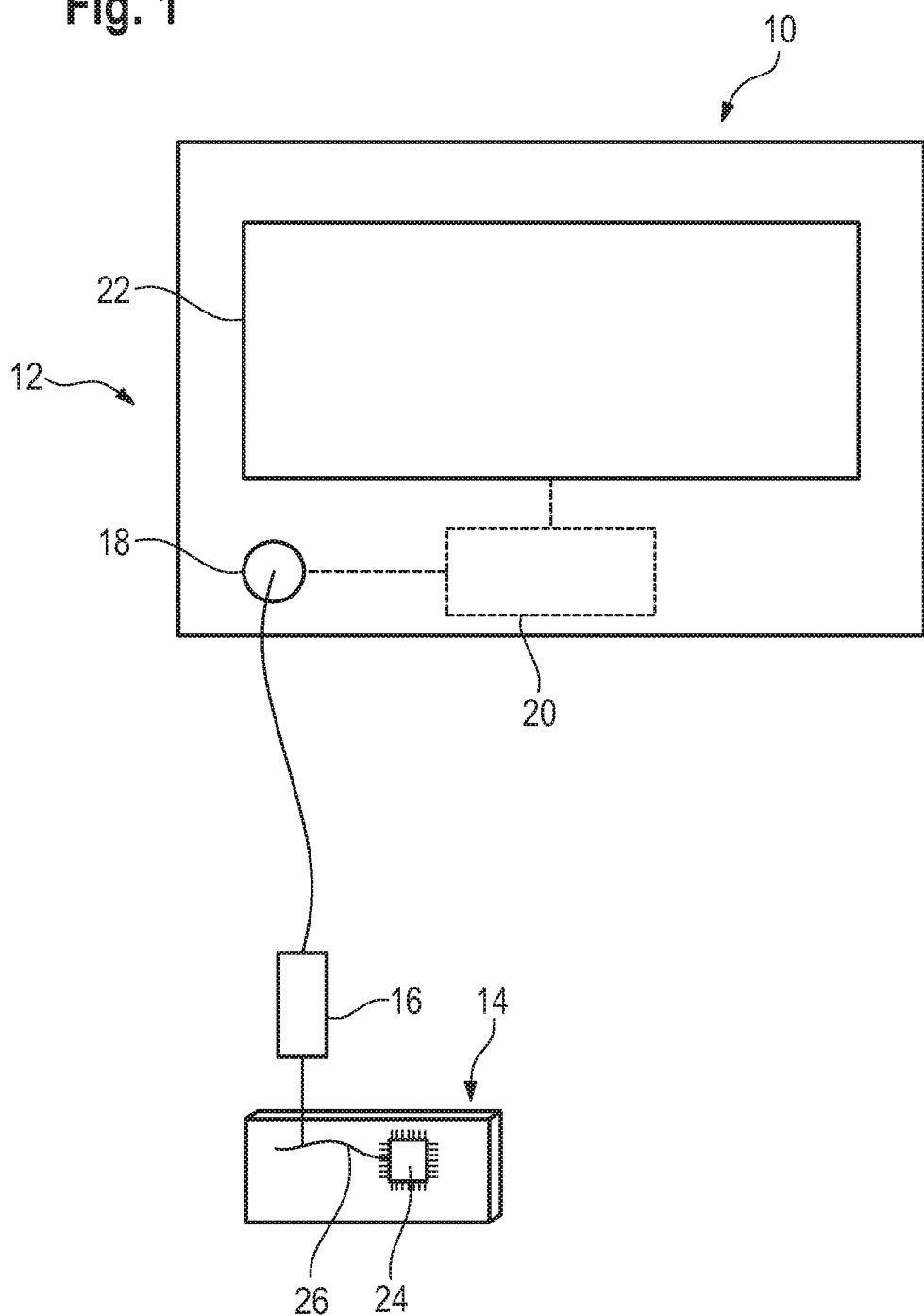
FIG. 1 schematically shows a measurement system with a measurement instrument according to an embodiment of the disclosure.

FIG. 1 schematically shows a measurement system 10 comprising a measurement instrument 12 and a device under test 14. The measurement instrument 12 comprises a probe 16, an input channel 18, an analysis module 20 comprising one or more analysis circuits and a display 22.

The probe 16 is connected to the input channel 18 which in turn is connected to the analysis module 20. The display 22 is connected to the analysis module 20 and/or to the input channel 18 directly. Typically, a housing is provided that encompasses at least the analysis module 20.

Generally, the measurement instrument 12 may comprise an oscilloscope, as a spectrum analyzer, as a vector network analyzer or as any other kind of measurement device being configured to measure certain properties of the device under test 14.

The device under test 14 comprises a signal source 24 as well as a transmission channel 26 connected to the signal source 24.

In general, the signal source 24 is configured to generate an electrical signal that propagates via the transmission channel 26. In some embodiments, the device under test 14 comprises a signal sink to which the signal generated by the signal source 24 propagates via the transmission channel 26.

More specifically, the signal source 24 generates the electrical signal that is then transmitted via the transmission channel 26 and probed by the probe 16, for example a tip of the probe 16. In some embodiments, the electrical signal generated by the signal source 24 is forwarded via the transmission channel 26 to a location where the probe 16, for example its tip, can contact the device under test 14 in order to measure the input signal. Thus, the electrical signal may generally be sensed between the signal source 24 and the signal sink assigned to the signal source 24, wherein the electrical signal may also be probed at the signal source 24 or the signal sink directly. Put another way, the measurement instrument 12, for example the analysis module 20, receives an input signal via the probe 16 that senses the electrical signal.

The input signal probed is forwarded to the analysis module 20 via the input channel 18. The input signal is then processed and/or analyzed by the analysis module 20 in order to determine the properties of the device under test 14.

Therein and in the following, the term "input signal" is understood to be a collective term for all stages of the signal generated by the signal source 24 that exist before the signal reaches the analysis module 20. In other words, the input signal may be altered by the transmission channel 26 and/or by other components of the device under test 14 and/or of the measurement instrument 12 that process the input signal before it reaches the analysis module 20. Accordingly, the input signal relates to the signal that is received and analyzed by the analysis module 20.

The input signal usually contains perturbations in the form of total jitter (TJ) that is a perturbation in time and total noise (TN) that is a perturbation in amplitude. The total jitter and the total noise in turn each comprise several components. Note that the abbreviations introduced in parentheses will be used in the following.

Figure 2:
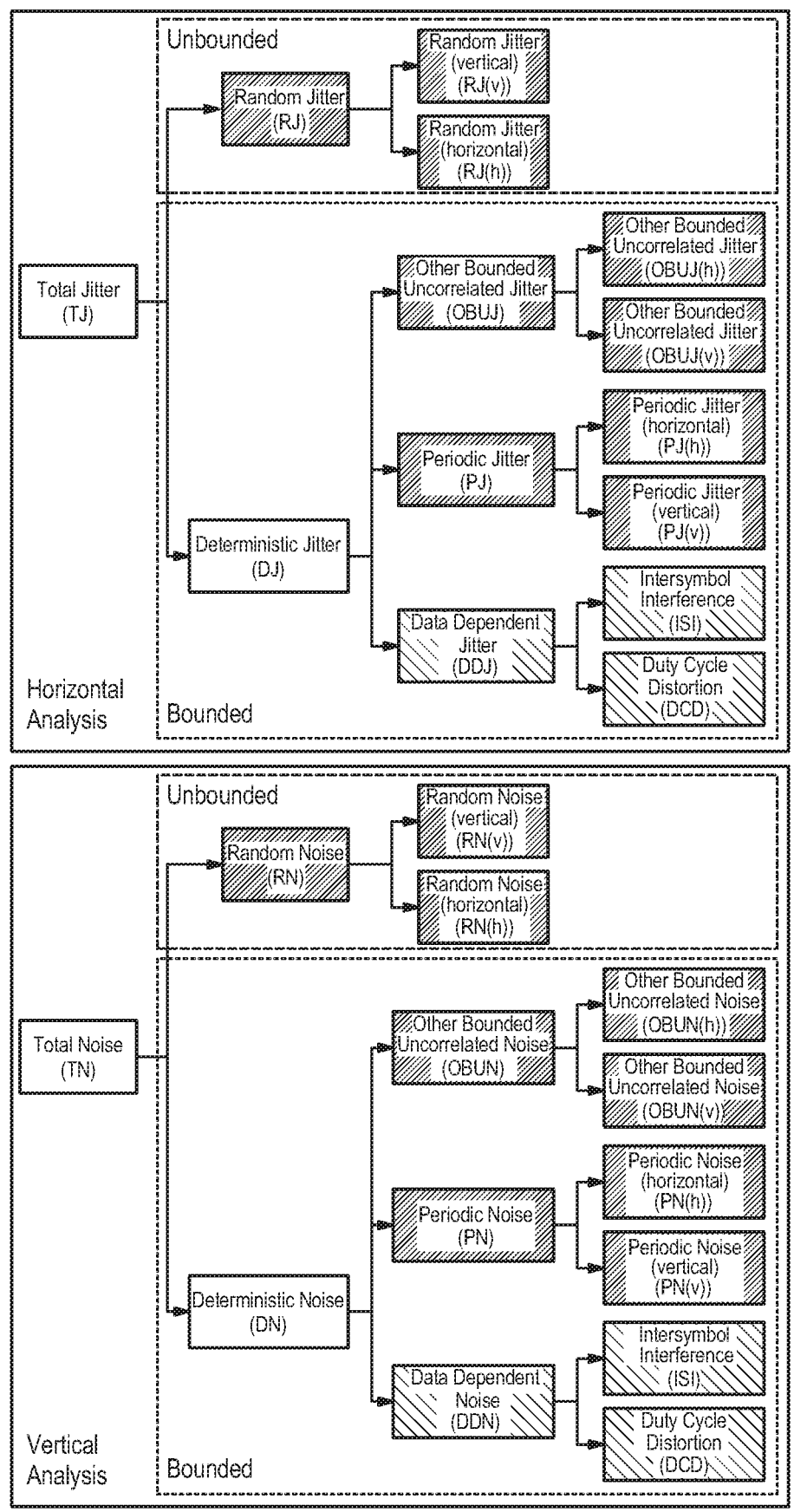
FIG. 2 shows a tree diagram of different types of jitter and different types of noise.

As is shown in FIG. 2, the total jitter (TJ) is composed of random jitter (RJ) and deterministic jitter (DJ), wherein the random jitter (RJ) is unbounded and randomly distributed, and wherein the deterministic jitter (DJ) is bounded.

The deterministic jitter (DJ) itself comprises data dependent jitter (DDJ), periodic jitter (PJ) and other bounded uncorrelated jitter (OBUJ).

The data dependent jitter is directly correlated with the input signal, for example directly correlated with signal edges in the input signal. The periodic jitter is uncorrelated with the input signal and comprises perturbations that are periodic, for example in time. The other bounded uncorrelated jitter comprises all deterministic perturbations that are neither correlated with the input signal nor periodic. The data dependent jitter comprises up to two components, namely inter-symbol interference (ISI) and duty cycle distortion (DCD).

Analogously, the total noise (TN) comprises random noise (RN) and deterministic noise (DN), wherein the deterministic noise contains data dependent noise (DDN), periodic noise (PN) and other bounded uncorrelated noise (OBUN).

Similarly to the jitter, the data dependent noise is directly correlated with the input signal, for example directly correlated with signal edges in the input signal. The periodic noise is uncorrelated with the input signal and comprises perturbations that are periodic, for example in amplitude. The other bounded uncorrelated noise comprises all deterministic perturbations that are neither correlated with the input signal nor periodic. The data dependent noise comprises up to two components, namely inter-symbol interference (ISI) and duty cycle distortion (DCD).

In general, there is cross-talk between the perturbations in time and the perturbations in amplitude.

Put another way, jitter may be caused by "horizontal" temporal perturbations, which is denoted by "(h)" in FIG. 2 and in the following, and/or by "vertical" amplitude perturbations, which is denoted by a "(v)" in FIG. 2 and in the following.

Likewise, noise may be caused by "horizontal" temporal perturbations, which is denoted by "(h)" in FIG. 2 and in the following, and/or by "vertical" amplitude perturbations, which is denoted by a "(v)" in FIG. 2 and in the following.

In detail, the terminology used below is the following:

Horizontal periodic jitter PJ(h) is periodic jitter that is caused by a temporal perturbation.

Vertical periodic jitter PJ(v) is periodic jitter that is caused by an amplitude perturbation.

Horizontal other bounded uncorrelated jitter OBUJ(h) is other bounded uncorrelated jitter that is caused by a temporal perturbation.

Vertical other bounded uncorrelated jitter OBUJ(v) is other bounded uncorrelated jitter that is caused by an amplitude perturbation.

Horizontal random jitter RJ(h) is random jitter that is caused by a temporal perturbation.

Vertical random jitter RJ(v) is random jitter that is caused by an amplitude perturbation.

The definitions for noise are analogous to those for jitter:

Horizontal periodic noise PN (h) is periodic noise that is caused by a temporal perturbation.

Vertical periodic noise PN(v) is periodic noise that is caused by an amplitude perturbation.

Horizontal other bounded uncorrelated noise OBUN(h) is other bounded uncorrelated noise that is caused by a temporal perturbation.

Vertical other bounded uncorrelated noise OBUN(v) is other bounded uncorrelated noise that is caused by an amplitude perturbation.

Horizontal random noise RN(h) is random noise that is caused by a temporal perturbation.

Vertical random noise RN(v) is random noise that is caused by an amplitude perturbation.

As mentioned above, noise and jitter each may be caused by "horizontal" temporal perturbations and/or by "vertical" amplitude perturbations.

Figure 3:
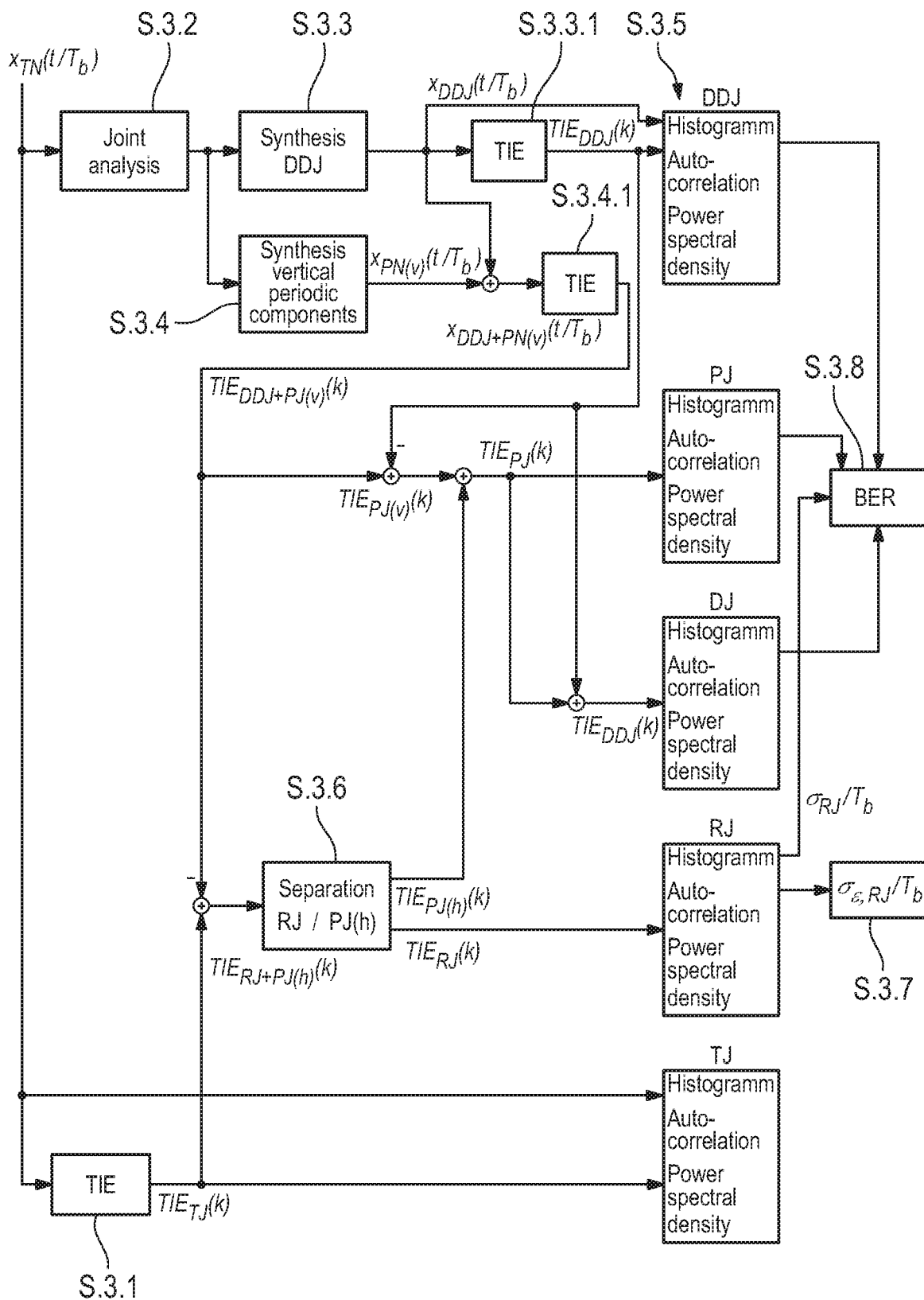
FIG. 3 shows a flow chart of a jitter determination method according to an embodiment of the disclosure.
Figure 4:
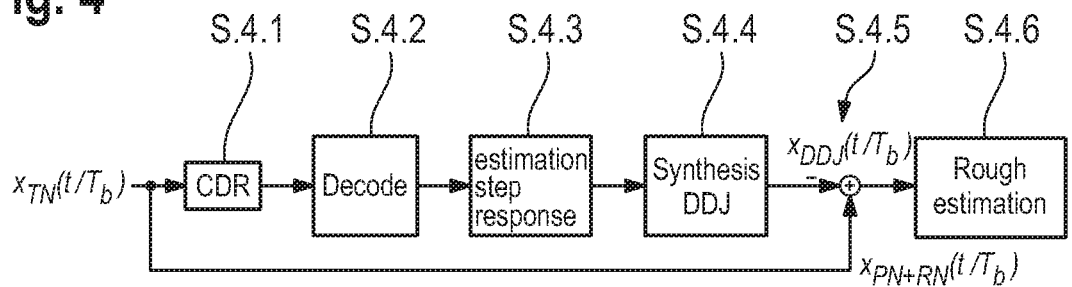
FIG. 4 shows a flow chart of a signal parameter determination method according to an embodiment of the disclosure.
Figure 6:
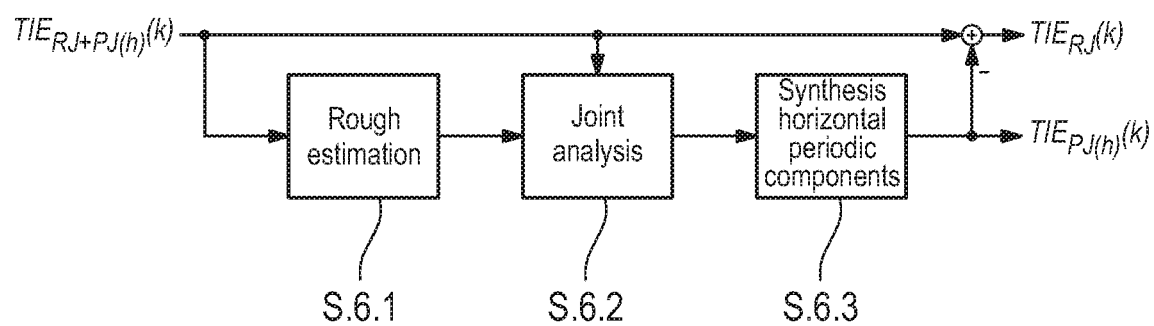
FIG. 6 shows a flow chart of a method for separating random jitter and horizontal periodic jitter according to an embodiment of the disclosure.

The measurement instrument 12 or rather the analysis module 20 is configured to perform the steps schematically shown, for example, in FIGS. 3, 4, 6, and/or 8 in order to analyze the jitter and/or noise components contained within the input signal, namely the jitter and/or noise components mentioned above.

In some embodiments, one or more computer-readable storage media is provided containing computer readable instructions embodied thereon that, when executed by one or more computing devices (e.g., microprocessor, microcontroller, CPU, DSP, Graphics processor, etc.) contained in or associated with the measurement instrument 12, the analysis module 20, etc.), cause the one or more computing devices to perform one or more steps of the method of FIGS. 3, 4, 6, and/or 8 described below.

Model of the Input Signal

First of all, a mathematical substitute model of the input signal or rather of the jitter components and the noise components of the input signal is established. Without loss of generality, the input signal is assumed to be PAM-n coded in the following, wherein n is an integer bigger than 1. Hence, the input signal may be a binary signal (PAM-2 coded).

Based on the categorization explained above with reference to FIG. 2, the input signal at a time $t/T_b$ is modelled as $$x_{TN}(t/T_b) = \sum_{k=-N_{pre}}^{N_{post}} b(k) \cdot h(t/T_b - k - \varepsilon(k)/T_b) + \qquad \text{(E. 1)}$$
$$\sum_{i=0}^{N_{PN(v)}-1} A_i \cdot \sin(2\pi \cdot f_i/f_b \cdot t/T_b + \phi_i) +$$
$$x_{RN(v)}(t/T_b) + x_{OBUN(v)}(t/T_b).$$

In the first term, namely $$\sum_{k=-N_{pre}}^{N_{post}} b(k) \cdot h(t/T_b - k - \varepsilon(k)/T_b),$$

b(k) represents a bit sequence sent by the signal source 24 via the transmission channel 26, wherein $T_b$ is the bit period.

Note that strictly speaking the term "bit" is only correct for a PAM-2 coded input signal. However, the term "bit" is to be understood to also include a corresponding signal symbol of the PAM-n coded input signal for arbitrary integer n.

$h(t/T_b)$ is the joint impulse response of the signal source 24 and the transmission channel 26. In case of directly probing the signal source 24, $h(t/T_b)$ is the impulse response of the signal source 24 since no transmission channel 26 is provided or rather necessary.

Note that the joint impulse response $h(t/T_b)$ does not comprise contributions that are caused by the probe 16, as these contributions are usually compensated by the measurement instrument 12 or the probe 16 itself in a process called "de-embedding". Moreover, contributions from the probe 16 to the joint impulse response $h(t/T_b)$ may be negligible compared to contributions from the signal source 24 and the transmission channel 26.

$N_{pre}$ and $N_{post}$ respectively represent the number of bits before and after the current bit that perturb the input signal due to inter-symbol interference. As already mentioned, the length $N_{pre}+N_{post}+1$ may comprise several bits, for example several hundred bits, especially in case of occurring reflections in the transmission channel 26.

Further, $\varepsilon(k)$ is a function describing the time perturbation, i.e. $\varepsilon(k)$ represents the temporal jitter.

Moreover, the input signal also contains periodic noise perturbations, which are represented by the second term in equation (E.1), namely $$\sum_{i=0}^{N_{PN(v)}-1} A_i \cdot \sin(2\pi \cdot f_i/f_b \cdot t/T_b + \phi_i).$$

The periodic noise perturbation is modelled by a series over $N_{PN(v)}$ sine-functions with respective amplitudes $A_i$, frequencies $f_i$ and phases $\phi_i$, which is equivalent to a Fourier series of the vertical periodic noise.

The last two terms in equation (E.1), namely $$+x_{RN(v)}(t/T_b)+x_{OBUN(v)}(t/T_b),$$

represent the vertical random noise and the vertical other bounded uncorrelated noise contained in the input signal, respectively.

The function $\varepsilon(k)$ describing the temporal jitter is modelled as follows:

$$\varepsilon(k)/T_b = \qquad \qquad \text{(E. 2)}$$
$$\sum_{i=0}^{N_{PJ(h)}-1} a_i/T_b \cdot \sin(2\pi \cdot \vartheta_i / f_b \cdot k + \varphi_i) + \varepsilon_{RJ}(k)/T_b + \varepsilon_{OBUJ}(k)/T_b.$$

The first term in equation (E.2), namely $$\sum_{i=0}^{N_{PJ(h)}-1} a_i/T_b \cdot \sin(2\pi \cdot \vartheta_i / f_b \cdot k + \varphi_i),$$

represents the periodic jitter components that are modelled by a series over $N_{PJ(h)}$ sine-functions with respective amplitudes $a_i$, frequencies $\vartheta_1$ and phases $\varphi_i$, which is equivalent to a Fourier series of the horizontal periodic jitter.

The last two terms in equation (E.2), namely $$\varepsilon_{RJ}(k)/T_b + \varepsilon_{OBUJ}(k)/T_b,$$

represent the random jitter and the other bounded uncorrelated jitter contained in the total jitter, respectively.

In order to model duty cycle distortion (DCD), the model of (E.1) has to be adapted to depend on the joint step response $h_s(t/T_b, b(k))$ of the signal source 24 and the transmission channel 26.

As mentioned earlier, the step response $h_s(t/T_b, b(k))$ of the signal source 24 may be taken into account provided that the input signal is probed at the signal source 24 directly.

Generally, duty cycle distortion (DCD) occurs when the step response for a rising edge signal is different to the one for a falling edge signal.

The inter-symbol interference relates, for example, to limited transmission channel or rather reflection in the transmission.

The adapted model of the input signal due to the respective step response is given by $$x_{TN}(t/T_b) = \qquad \qquad \text{(E. 3)}$$
$$\sum_{k=-N_{pre}}^{N_{post}} [b(k)-b(k-1)] \cdot h_s(t/T_b - k - \varepsilon(k)/T_b, b(k)) +$$
$$x_{-\infty} + \sum_{i=0}^{N_{PN(v)}-1} A_i \cdot \sin(2\pi \cdot f_i/f_b \cdot t/T_b + \phi_i) +$$
$$x_{RN(v)}(t/T_b) + x_{OBUN(v)}(t/T_b).$$

Therein, $x_{-\infty}$ represents the state at the start of the transmission of the input signal, for example the state of the signal source 24 and the transmission channel 26 at the start of the transmission of the input signal.

The step response $h_s(t/T_b, b(k))$ depends on the bit sequence $b(k)$, or more precisely on a sequence of $N_{DCD}$ bits of the bit sequence $b(k)$, wherein $N_{DCD}$ is an integer bigger than 1.

Note that there is an alternative formulation of the duty cycle distortion that employs $N_{DCD}=1$. This formulation, however, is a mere mathematical reformulation of the same problem and thus equivalent to the present disclosure.

Accordingly, the step response $h_s(t/T_b, b(k))$ may generally depend on a sequence of $N_{DCD}$ bits of the bit sequence $b(k)$, wherein $N_{DCD}$ is an integer value.

Typically, the dependency of the step response $h_s(t/T_b, b(k))$ on the bit sequence $b(k)$ ranges only over a few bits, for instance $N_{DCD}=2, 3, \ldots, 6$.

For $N_{DCD}=2$ this is known as "double edge response (DER)", while for $N_{DCD}>2$ this is known as "multi edge response (MER)".

Without restriction of generality, the case $N_{DCD}=2$ is described in the following. However, the outlined steps also apply to the case $N_{DCD}>2$ with the appropriate changes. As indicated above, the following may also be (mathematically) reformulated for $N_{DCD}=1$.

In equation (E.3), the term $b(k)-b(k-1)$, which is multiplied with the step response $h_s(t/T_b, b(k))$, takes two subsequent bit sequences, namely $b(k)$ and $b(k-1)$, into account such that a certain signal edge is encompassed.

In general, there may be two different values for the step response $h_s(t/T_b, b(k))$, namely $h_s^{(r)}(t/T_b)$ for a rising signal edge and $h_s^{(f)}(t/T_b)$ for a falling signal edge. In other words, the step response $h_s(t/T_b, b(k))$ may take the following two values:

$$h_s(t/T_b, b(k)) = \begin{cases} h_s^{(r)}(t/T_b), & b(k)-b(k-1) \geq 0 \\ h_s^{(f)}(t/T_b), & b(k)-b(k-1) < 0 \end{cases} \qquad \text{(E. 4)}$$

If the temporal jitter $\varepsilon(k)$ is small, equation (E.3) can be linearized and then becomes $$x_{TN}(t/T_b) \approx \sum_{k=-N_{pre}}^{N_{post}} [b(k)-b(k-1)] \cdot h_s(t/T_b - k, b(k)) + \qquad \text{(E. 5)}$$
$$x_{-\infty} + \sum_{i=0}^{N_{PN(v)}-1} A_i \cdot \sin(2\pi \cdot f_i/f_b \cdot t/T_b + \phi_i) +$$
$$x_{RN(v)}(t/T_b) + x_{OBUN(v)}(t/T_b) -$$
$$\sum_{k=-N_{pre}}^{N_{post}} \varepsilon(k)/T_b \cdot [b(k)-b(k-1)] \cdot h(t/T_b - k, b(k)).$$

Note that the last term in equation (E.5), namely $$\sum_{k=-N_{pre}}^{N_{post}} \varepsilon(k)/T_b \cdot [b(k)-b(k-1)] \cdot h(t/T_b - k, b(k)),$$

describes an amplitude perturbation that is caused by the temporal jitter $\varepsilon(k)$.

It is to be noted that the input signal comprises the total jitter as well as the total noise so that the input signal may also be labelled by $x_{TJ}(t/T_b)$.

Clock Data Recovery

A clock data recovery is now performed based on the received input signal employing a clock timing model of the input signal, which clock timing model is a slightly modified version of the substitute model explained above. The clock timing model will be explained in more detail below.

Generally, the clock signal $T_{clk}$ is determined while simultaneously determining the bit period $T_b$ from the times $t_{edge}(i)$ of signal edges based on the received input signal.

More precisely, the bit period $T_b$ scaled by the sampling rate $1/T_a$ is inter alia determined by the analysis module 20.

In the following, $\hat{T}_b/T_a$ is understood to be the bit period that is determined by the analysis module 20. The symbol "^" marks quantities that are determined by the analysis module 20, for example quantities that are estimated by the analysis module 20.

One aim of the clock data recovery is to also determine a time interval error TIE(k) caused by the different types of perturbations explained above.

Moreover, the clock data recovery may also be used for decoding the input signal, for determining the step response $h(t\backslash T_b)$ and/or for reconstructing the input signal. Each of these applications will be explained in more detail below.

Note that for each of these applications, the same clock data recovery may be performed. Alternatively, a different type of clock data recovery may be performed for at least one of these applications.

In order to enhance the precision or rather accuracy of the clock data recovery, the bit period $\hat{T}_b/T_a$ is determined jointly with at least one of the deterministic jitter components mentioned above and with a deviation $\Delta \hat{T}_a$ from the bit period $\hat{T}_b/T_a$.

In the case described in the following, the bit period $\hat{T}_b/T_a$ and the deviation $\Delta \hat{T}_b/T_a$ are estimated together with the data dependent jitter component and the periodic jitter components. Therefore, the respective jitter components are taken into account when providing a cost functional that is to be minimized.

The principle of minimizing a cost functional, also called criterion, in order to determine the clock signal $T_{clk}$ is known.

More precisely, the bit period $\hat{T}_b/T_a$ and the deviation $\Delta \hat{T}_b/T_a$ are determined by determining the times $t_{edge}(i)$ of signal edges based on the received input signal and by then minimizing the following cost functional K, for example by employing a least mean squares approach:

$$K = \sum_{i=0}^{N-1} \left[ \frac{t_{edge}(i)}{T_a} - k_{i,\eta} \cdot \frac{\hat{T}_b(\eta)}{T_a} - \frac{\Delta \hat{T}_b(\eta)}{T_a} - \sum_{L_{ISI_{pre}}}^{L_{ISI_{post}}} \hat{h}_{r,f}(k_i - \xi, b(k_i), b(k_i - 1), b(k_i - \xi), b(k_i - \xi - 1)) - \sum_{\mu=0}^{M_{PJ}-1} \hat{C}_\mu \cdot \sin(2\pi \cdot \hat{v}_\mu / T_a \cdot k_i + \hat{\Psi}_\mu) \right]^2. \qquad (E.\ 6)$$

As mentioned above, the cost functional K used by the method according to the present disclosure comprises terms concerning the data dependent jitter component, which is represented by the fourth term in equation (E.6) and the periodic jitter components, which are represented by the fifth term in equation (E.6), namely the vertical periodic jitter components and/or the horizontal periodic jitter components.

Therein, $L_{ISI}$, namely the length $L_{ISI_{pre}} + L_{ISI_{post}}$, is the length of an Inter-symbol Interference filter (ISI-filter) $\hat{h}_{r,f}(k)$ that is known from the state of the art and that is used to model the data dependent jitter. The length $L_{ISI}$ should be chosen to be equal or longer than the length of the impulse response, namely the one of the signal source 24 and the transmission channel 26.

Hence, the cost functional K takes several signal perturbations into account rather than assigning their influences to (random) distortions as typically done in the prior art.

In some embodiments, the term $$\sum_{L_{ISI_{pre}}}^{L_{ISI_{post}}} \hat{h}_{r,f}(k_i - \xi, b(k_i), b(k_i - 1), b(k_i - \xi), b(k_i - \xi - 1))$$

relates to the data dependent jitter component. The term assigned to the data dependent jitter component has several arguments for improving the accuracy since neighbored edge signals, also called aggressors, are taken into account that influence the edge signal under investigation, also called victim.

In addition, the term $$\sum_{\mu=0}^{M_{PJ}-1} \hat{C}_\mu \cdot \sin(2\pi \cdot \hat{v}_\mu / T_a \cdot k_i + \hat{\Psi}_\mu)$$

concerns the periodic jitter components, namely the vertical periodic jitter components and/or the horizontal periodic jitter components, that are also explicitly mentioned as described above. Put it another way, it is assumed that periodic perturbations occur in the received input signal which are taken into consideration appropriately.

If the signal source 24 is configured to perform spread spectrum clocking, then the bit period $T_b/T_a$ is not constant but varies over time.

The bit period can then, as shown above, be written as a constant central bit period $T_b$, namely a central bit period being constant in time, plus a deviation $\Delta T_b$ from the central bit period $T_b$, wherein the deviation $\Delta T_b$ varies over time.

In this case, the period of observation is divided into several time slices or rather time sub-ranges. For ensuring the above concept, the several time slices are short such that the central bit period $T_b$ is constant in time.

The central bit period $T_b$ and the deviation $\Delta T_b$ are determined for every time slice or rather time sub-range by minimizing the following cost functional K:

$$K = \sum_{i=0}^{N-1} \left[ \frac{t_{edge}(i)}{T_a} - k_{i,\eta} \cdot \frac{\hat{T}_b(\eta)}{T_a} - \frac{\Delta \hat{T}_b(\eta)}{T_a} - \sum_{L_{ISI_{pre}}}^{L_{ISI_{post}}} \hat{h}_{r,f}(k_i - \xi, b(k_i), b(k_i - 1), b(k_i - \xi), b(k_i - \xi - 1)) - \sum_{\mu=0}^{M_{PJ}-1} \hat{C}_\mu \cdot \sin(2\pi \cdot \hat{v}_\mu / T_a \cdot k_i + \hat{\Psi}_\mu) \right]^2, \qquad (E.\ 7)$$

which is the same cost functional as the one in equation (E.6).

Based on the determined bit period $\hat{T}_b/T_a$ and based on the determined deviation $\Delta\hat{T}_b/T_a$, the time interval error $TIE(i)/T_a$ is determined as $$TIE(i)/T_a = t_{edge}(i)/T_a - k_{i,\eta} \cdot \hat{T}_b(\eta)T_a - \Delta\hat{T}_b(\eta)/T_a.$$

Put another way, the time interval error $TIE(i)/T_a$ corresponds to the first three terms in equations (E.6) and (E.7), respectively.

However, one or more of the jitter components may also be incorporated into the definition of the time interval error $TIE(i)/T_a$.

In the equation above regarding the time interval error $TIE(i)/T_a$, the term $k_{i,\eta} \cdot \hat{T}_b(\eta)/T_a + \Delta\hat{T}_b(\eta)/T_a$ represents the clock signal for the i-th signal edge. This relation can be rewritten as follows $\hat{T}_{clk} = k_{i,\eta} \cdot \hat{T}_b(\eta)/T_a + \Delta\hat{T}_b(\eta)/T_a$.

As already described, a least mean squares approach is applied with which at least the constant central bit period $T_b$ and the deviation $\Delta T_b$ from the central bit period $T_b$ are determined.

In other words, the time interval error $TIE(i)/T_a$ is determined and the clock signal $T_{clk}$ is recovered by the analysis described above.

In some embodiments, the total time interval error $TIE_{TJ}(k)$ is determined employing the clock data recovery method described above (step S.3.1 in FIG. 3).

Generally, the precision or rather accuracy is improved since the occurring perturbations are considered when determining the bit period by determining the times $t_{edge}(i)$ of signal edges based on the received input signal and by then minimizing the cost functional K.

Decoding the Input Signal

With the recovered clock signal $T_{clk}$ determined by the clock recovery analysis described above, the input signal is divided into the individual symbol intervals and the values of the individual symbols ("bits") b(k) are determined.

The signal edges are assigned to respective symbol intervals due to their times, namely the times $t_{edge}(i)$ of signal edges. Usually, only one signal edge appears per symbol interval.

In other words, the input signal is decoded by the analysis module 20, thereby generating a decoded input signal. Thus, b(k) represents the decoded input signal.

The step of decoding the input signal may be skipped if the input signal comprises an already known bit sequence. For example, the input signal may be a standardized signal such as a test signal that is determined by a communication protocol. In this case, the input signal does not need to be decoded, as the bit sequence contained in the input signal is already known.

Joint Analysis of the Step Response and of the Periodic Signal Components

The analysis module 20 is configured to jointly determine the step response of the signal source 24 and the transmission channel 26 on one hand and the vertical periodic noise parameters defined in equation (E.5) on the other hand, wherein the vertical periodic noise parameters are the amplitudes $A_i$, the frequencies $f_i$ and the phases $\phi_i$ (step S.3.2 in FIG. 3).

Therein and in the following, the term "determine" is understood to mean that the corresponding quantity may be computed and/or estimated with a predefined accuracy.

Thus, the term "jointly determined" also encompasses the meaning that the respective quantities are jointly estimated with a predefined accuracy.

However, the vertical periodic jitter parameters may also be jointly determined with the step response of the signal source 24 and the transmission channel 26 in a similar manner.

The concept is generally called joint analysis method.

In general, the precision or rather accuracy is improved due to jointly determining the step response and the periodic signal components.

Put differently, the first three terms in equation (E.5), namely $$\sum_{k=-N_{pre}}^{N_{post}} [b(k) - b(k-1)] \cdot h_s(t/T_b - k, b(k)) +$$

$$x_{-\infty} + \sum_{i=0}^{N_{PN(v)}-1} A_i \cdot \sin(2\pi \cdot f_i/f_b \cdot t/T_b + \phi_i),$$

are jointly determined by the analysis module 20.

As a first step, the amplitudes $A_i$, the frequencies $f_i$ and the phases $\phi_i$ are roughly estimated via the steps depicted in FIG. 4.

First, a clock data recovery is performed based on the received input signal (step S.4.1), for example as described above.

Second, the input signal is decoded (step S.4.2).

Then, the step response, for example the one of the signal source 24 and the transmission channel 26, is roughly estimated based on the decoded input signal (step S.4.3), for example by matching the first term in equation (E.5) to the measured input signal, for example via a least mean squares approach.

Therein and in the following, the term "roughly estimated" is to be understood to mean that the corresponding quantity is estimated with an accuracy being lower compared to the case if the quantity is determined.

Now, a data dependent jitter signal $x_{DDJ}$ being a component of the input signal only comprising data dependent jitter is reconstructed based on the roughly estimated step response (step S.4.4).

The data dependent jitter signal $x_{DDJ}$ is subtracted from the input signal (step S.4.5). The result of the subtraction is the signal $x_{PN+RN}$ that approximately only contains periodic noise and random noise.

Finally, the periodic noise parameters $A_i$, $f_i$, $\phi_i$ are roughly estimated based on the signal $x_{PN+RN}$ (step S.4.6), for example via a fast Fourier transform of the signal $x_{PN+RN}$.

In the following, these roughly estimated parameters are marked by subscripts "0", i.e. the rough estimates of the frequencies are $f_{i,0}$ and the rough estimates of the phases are $\phi_{i,0}$. The roughly estimated frequencies $f_{i,0}$ and phases $\phi_{i,0}$ correspond to working points for linearizing purposes as shown hereinafter.

Accordingly, the frequencies and phases can be rewritten as follows:

$$f_i/f_b = f_{i,0}/f_b + \Delta f_i/f_b$$

$$\phi_i = \phi_{i,0} + \Delta\phi_i \quad (E.8)$$

Therein, $\Delta f_i$ and $\Delta\phi_i$ are deviations of the roughly estimated frequencies $f_{i,0}$ and phases $\phi_{i,0}$ from the actual frequencies and phases, respectively. By construction, the deviations $\Delta f_i$ and $\Delta\phi_i$ are much smaller than the associated frequencies $f_i$ and phases $\phi_i$, respectively.

With the re-parameterization above, the sine-function in the third term in equation (E.5), namely $$\sum_{i=0}^{N_{PN(v)}-1} A_i \cdot \sin(2\pi \cdot f_i/f_b \cdot t/T_b + \phi_i),$$

can be linearized as follows while using small-angle approximation or rather the Taylor series:

$$A_i \cdot \sin(2\pi \cdot f_i/f_b \cdot t/T_b + \phi_i) = A_i \cdot \sin(2\pi \cdot f_{i,0}/f_b \cdot t/T_b + \phi_{i,0} + \quad (E.\ 9)$$
$$2\pi \cdot \Delta f_i/f_b \cdot t/T_b + \Delta\phi_i)$$
$$= A_i \cdot [\sin(2\pi \cdot f_{i,0}/f_b \cdot t/T_b + \phi_{i,0}) \cdot$$
$$\cos(2\pi \cdot \Delta f_i/f_b \cdot t/T_b + \Delta\phi_i) +$$
$$\cos(2\pi \cdot f_{i,0}/f_b \cdot t/T_b + \phi_{i,0}) \cdot$$
$$\sin(2\pi \cdot \Delta f_i/f_b \cdot t/T_b + \Delta\phi_i)]$$
$$\approx A_i \cdot \sin(2\pi \cdot f_{i,0}/f_b \cdot t/T_b + \phi_{i,0}) +$$
$$A_i \cdot \cos(2\pi \cdot f_{i,0}/f_b \cdot t/T_b + \phi_{i,0}) \cdot$$
$$[2\pi \cdot \Delta f_i/f_b \cdot t/T_b + \Delta\phi_i]$$
$$= p_{i,0} \cdot \sin(2\pi \cdot f_{i,0}/f_b \cdot t/T_b + \phi_{i,0}) +$$
$$p_{i,1} \cdot 2\pi \cdot t/T_b \cdot$$
$$\cos(2\pi \cdot f_{i,0}/f_b \cdot t/T_b + \phi_{i,0}) +$$
$$p_{i,2} \cdot \cos(2\pi \cdot f_{i,0}/f_b \cdot t/T_b + \phi_{i,0}).$$

In the last two lines of equation (E.9), the following new, linearly independent parameters have been introduced, which are determined afterwards:

$$p_{i,0} = A_i$$
$$p_{i,1} = A_i \cdot \Delta f_i/f_b$$
$$p_{i,2} = A_i \cdot \Delta\phi_i \quad (E.10)$$

With the mathematical substitute model of equation (E.5) adapted that way, the analysis module 20 can now determine the step response $h_s(t/T_b, b(k))$, more precisely the step response $h_s^{(r)}(t/T_b)$ for rising signal edges and the step response $h_s^{(f)}(t/T_b)$ for falling signal edges, and the vertical periodic noise parameters, namely the amplitudes $A_i$, the frequencies $f_i$ and the phases $\phi_i$, jointly, i.e. at the same time.

This may be achieved by minimizing a corresponding cost functional K, for example by applying a least mean squares method to the cost functional K. The cost functional has the following general form:

$$K = [\underline{A}(k) \cdot \hat{\underline{x}} - \underline{x}_L(k)]^T \cdot [\underline{A}(k) \cdot \hat{\underline{x}} - \underline{x}_L(k)]. \quad (E.11)$$

Therein, $\underline{x}_L(k)$ is a vector containing L measurement points of the measured input signal. $\hat{\underline{x}}$ is a corresponding vector of the input signal that is modelled as in the first three terms of equation (E.5) and that is to be determined. $\underline{A}(k)$ is a matrix depending on the parameters that are to be determined.

In some embodiments, matrix $\underline{A}(k)$ comprises weighting factors for the parameters to be determined that are assigned to the vector $\underline{x}_L(k)$.

Accordingly, the vector $\underline{x}_L(k)$ may be assigned to the step response $h_s^{(r)}(t/T_b)$ for rising signal edges, the step response $h_s^{(f)}(t/T_b)$ for falling signal edges as well as the vertical periodic noise parameters, namely the amplitudes $A_i$, the frequencies $f_i$ and the phases $\phi_i$.

The least squares approach explained above can be extended to a so-called maximum-likelihood approach. In this case, the maximum-likelihood estimator $\hat{\underline{x}}_{ML}$ is given by $$\hat{\underline{x}}_{ML} = [\underline{A}^T(k) \cdot \underline{R}_n^{-1}(k) \cdot \underline{A}(k)]^{-1} \cdot [\underline{A}^T(k) \cdot \underline{R}_n^{-1}(k) \cdot \underline{x}_L(k)]. \quad (E.11a)$$

Therein, $\underline{R}_n(k)$ is the covariance matrix of the perturbations, i.e. the jitter and noise components comprised in equation (E.5).

Note that for the case of pure additive white Gaussian noise, the maximum-likelihood approach is equivalent to the least squares approach.

The maximum-likelihood approach may be simplified by assuming that the perturbations are not correlated with each other. In this case, the maximum-likelihood estimator becomes $$\hat{\underline{x}}_{ML} \approx [\underline{A}^T(k) \cdot ((\underline{r}_{n,i}(k) \cdot \underline{1}^T) \circ \underline{A}(k))]^{-1} \cdot [\underline{A}^T(k) \cdot (\underline{r}_{n,i}(k) \circ \underline{x}_L(k))]. \quad (E.11b)$$

Therein, $\underline{1}^T$ is a unit vector and the vector $\underline{r}_{n,i}(k)$ comprises the inverse variances of the perturbations.

For the case that only vertical random noise and horizontal random noise are considered as perturbations, this becomes $$[\underline{r}_{n,i}(k)]_l = \left( \frac{\sigma_{e,RJ}^2}{T_b^2} \sum_{m=-N_{post}}^{N_{pre}} [b(k-l-m) - b(k-l-m-1)]^2 \cdot (h(m, b(m)))^2 + \sigma_{RN(v)}^2 \right)^{-1} \quad (E.\ 11c)$$

Employing equation (E.11c) in equation (E.11b), an approximate maximum likelihood estimator is obtained for the case of vertical random noise and horizontal random noise being approximately Gaussian distributed.

If the input signal is established as a clock signal, i.e. if the value of the individual symbol periodically alternates between two values with one certain period, the approaches described above need to be adapted. The reason for this is that the steps responses usually extend over several bits and therefore cannot be fully observed in the case of a clock signal. In this case, the quantities above have to be adapted in the following way:

$$\hat{\underline{x}} = [(\hat{\underline{h}}_s^{(r)})^T (\hat{\underline{h}}_s^{(f)})^T \hat{\underline{p}}_{3N_{Pj}}^T]^T$$

$$\underline{A}(k) = [\underline{b}_{L,N}^{(r)}(k) - \underline{b}_{L,N}^{(r)}(k - T_b/T_a) \underline{b}_{L,N}^{(f)}(k) - \underline{b}_{L,N}^{(f)}(k - T_b/T_a) \underline{t}_{L,3N_{Pj}}(k)]$$

$$\underline{x}_L(k) = [\underline{b}_{L,N}^{(r)}(k) - \underline{b}_{L,N}^{(r)}(k - T_b/T_a)] \cdot \underline{h}_s^{(r)} + [\underline{b}_{L,N}^{(f)}(k - T_b/T_a)] \cdot h_s^{(f)} + \underline{t}_{L,3N_{Pj}} \cdot \underline{p}_{3N_{Pj}} + \underline{n}_L(k). \quad (E.11d)$$

Input Signal Reconstruction and Determination of Time Interval Error

With the determined step response and with the determined periodic noise signal parameters, a reconstructed signal $\hat{x}_{DDJ+PN(v)}(t/T_b)$ containing only data dependent jitter and vertical periodic noise can be determined while taking equation (E.5) into account.

Thus, the reconstructed signal $\hat{x}_{DDJ+PN(v)}(t/T_b)$ is given by $$\hat{x}_{DDJ+PN(v)}(t/T_b) = \hat{x}_{DDJ}(t/T_b) + \hat{x}_{PN(v)}(t/T_b) = \qquad (E.\ 12)$$
$$\sum_{k=-N_{pre}}^{N_{post}} [\hat{b}(k) - \hat{b}(k-1)] \cdot \hat{h}_s(t/T_b - k, \hat{b}(k)) +$$
$$\hat{x}_{-\infty} + \sum_{i=0}^{N_{PN(v)}-1} \hat{A}_i \cdot \sin(2\pi \cdot \hat{f}_i/f_b \cdot t/T_b + \hat{\phi}_i).$$

Moreover, also a reconstructed signal $\hat{x}_{DDJ}(t/T_b)$ containing only data dependent jitter and a reconstructed signal $\hat{x}_{PN(v)}(t/T_b)$ containing only vertical periodic noise are determined by the analysis module 20 (steps S.3.3 and S.3.4).

Based on the reconstructed signals $\hat{x}_{DDJ}(t/T_b)$ and $\hat{x}_{DDJ+PN(v)}(t/T_b)$, the time interval error $TIE_{DDJ}(k)$ that is associated with data dependent jitter and the time interval error $TIE_{DDJ+PJ(v)}(k)$ that is associated with data dependent jitter and with vertical periodic jitter are determined (steps S.3.3.1 and S.3.4.1).

Histograms

The analysis module 20 is configured to determine histograms of at least one component of the time interval error based on the corresponding time interval error (step S.3.5).

Generally speaking, the analysis unit 20 is firstly configured to determine the time interval error $TIE_{Jx}$ associated with a jitter component Jx. The analysis module 20 can determine a histogram associated with that jitter component Jx and may display it on the display 22.

FIGS. 5*a* to 5*d* show four examples of histograms determined by the analysis module 20 that correspond to total jitter, data dependent jitter, periodic jitter and random jitter, respectively.

In the cases of total jitter and data dependent jitter, rising signal edges and falling signal edges are treated separately such that information on duty cycle distortion is contained within the histogram.

Of course, a histogram corresponding only to certain components of the periodic jitter and/or of the random jitter may be determined and displayed, for example a histogram corresponding to at least one of horizontal periodic jitter, vertical periodic jitter, horizontal random jitter and vertical random jitter.

Figure 5A:
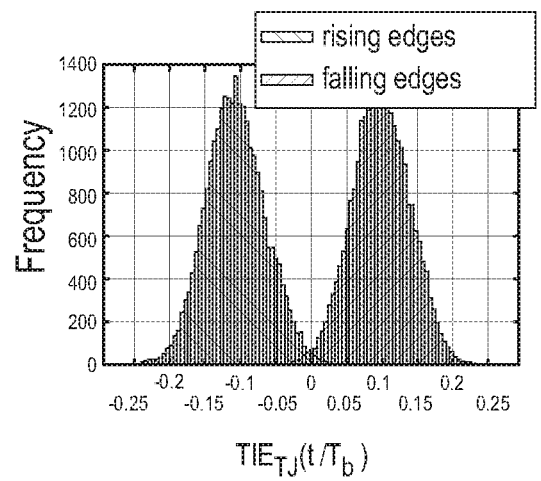
FIGS. 5a-5d show example histograms of different components of a time interval error.
Figure 5B:
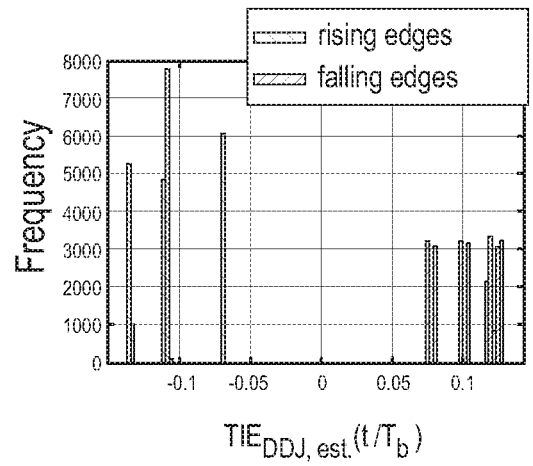
Figure 5C:
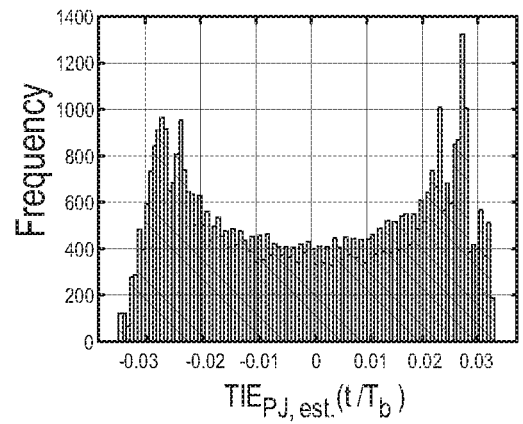
Figure 5D:
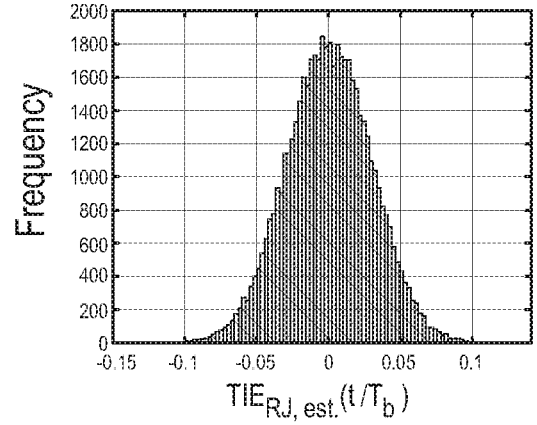

Note that from FIG. 5*d* it can readily be seen that the time interval error associated with the random jitter is Gaussian-distributed.

Moreover, the deterministic jitter and the random jitter are statistically independent from each other. Thus, the histogram of the total jitter may be determined by convolution of the histograms related to deterministic jitter and random jitter.

The measurement instrument 12 may be configured to selectively display one or more of the determined histograms on the display 22.

In some embodiments, the user may choose which of the jitter components are selectively displayed.

Thus, the histogram corresponding to the time interval error associated with at least one of the vertical periodic jitter, the horizontal periodic jitter, the vertical random jitter, the horizontal random jitter, the data dependent jitter and the other bounded uncorrelated jitter may be selectively displayed on the display 22.

Separation of Random Jitter and Horizontal Periodic Jitter

The analysis module 20 is configured to determine the time interval error $TIE_{RJ}$ that is associated with the random jitter and the time interval error $TIE_{PJ(h)}$ that is associated with the horizontal periodic jitter (step S.3.6).

As shown in FIG. 3, the total time interval error $TIE_{TJ}(k)$ and the time interval error $TIE_{DDJ+PJ(v)}$ that is associated with data dependent jitter and with vertical periodic jitter are determined firstly as already described above.

Then, $TIE_{DDJ+PJ(v)}$ is subtracted from the total time interval error $TIE_{TJ}(k)$ such that the time interval error $TIE_{RJ+PJ(h)}$ is obtained that only contains random jitter, horizontal periodic jitter and other bounded uncorrelated jitter. In this regard, reference is made to FIG. 2 illustrating an overview of the several jitter components.

Note that in the following, the other bounded uncorrelated jitter component is neglected. However, it may also be incorporated into the analysis described below.

Analogously to the joint analysis method described above (step S.3.2), also the horizontal periodic jitter defined by the first term in equation (E.2), for example its time interval error, can be determined by determining the corresponding amplitudes $a_i$, frequencies $\vartheta_i$ and phases $\varphi_i$. A flow chart of the corresponding method is depicted in FIG. 6.

For this purpose, the amplitudes $a_i$, frequencies $\vartheta_i$ and phases $\varphi_i$ are roughly estimated at first (step S.6.1).

Then, at least these parameters are determined jointly (step S.6.2).

The time interval error $TIE_{PJ(h)}$ that is associated with horizontal periodic jitter is then reconstructed (step S.6.3). The result is given by $$T\hat{I}E_{PJ(h)}(k) = \sum_{i=0}^{\hat{N}_{PJ(h)}-1} \hat{a}_i \cdot \sin(2\pi \cdot \hat{\vartheta}_i/f_b \cdot k + \hat{\varphi}_i). \qquad (E.\ 13)$$

From this, also the time interval error $TIE_{RJ}$ being associated only with random jitter is calculated by subtracting $T\hat{I}E_{PJ(h)}$ from $TIE_{RJ+PJ(h)}$.

Determination of Random Jitter

Generally, the analysis module 20 is configured to determine a statistical moment that is associated with the temporal random jitter $\varepsilon_{RJ}$. Therein, the statistical moment is of second order or higher.

In some embodiments, the analysis module 20 is configured to determine the variance $\sigma_{\varepsilon_{RJ}}^2$, that is associated with the temporal random jitter $\varepsilon_{RJ}$ (step S.3.7). This step is explained in more detail below.

The approach is based on determining an autocorrelation function $r_{TIE,TIE}(m)$ of the time interval error that is defined by $$r_{TIE,TIE}(m) = \frac{1}{N_{ACF}(m)} \sum_{c=0}^{N_{ACF}(m)-1} TIE(k) \cdot TIE(k+m),$$
$$m = 0, 1, \ldots, L_{ACF} - 1$$

wherein $N_{ACF}(m)$ is the number of elements that are taken into account for the calculation of the autocorrelation function. As shown, the number of elements depends on displacement parameter m.

Further, $L_{ACF}$ corresponds to the length of the autocorrelation function. The length may be adjustable by the user and/or may be equal to or bigger than the maximum of the maximal period of the periodic jitter and the length of the impulse response of the signal source 24 and the transmission channel 26.

In general, the analysis module 20 may be configured to selectively determine the respective autocorrelation function $r_{TIE_{Jx},TIE_{Jx}}(m)$ of any jitter component Jx.

Generally, the measurement instrument 12 may be configured to selectively display the autocorrelation function $r_{TIE_{Jx},TIE_{Jx}}(m)$ obtained on the display 22.

Accordingly, the approach for determining the variance $\sigma_{\varepsilon_{RJ}}^2$, namely the variance of the temporal random jitter $\varepsilon_{RJ}$, is based on determining the autocorrelation function $r_{TIE_{RJ},TIE_{RJ}}(m)$ of the random jitter.

A component $x_{DDJ+RJ}(t/T_b) \approx x_{DDJ}(t/T_b) + n_{RJ}(t/T_b)$ of the input signal contains the data dependent jitter signal $$x_{DDJ}(t/T_b) = \sum_{k=-N_{pre}}^{N_{post}} [b(k) - b(k-1)] \cdot h_s(t/T_b - k, b(k)) + x_{-\infty} \quad (E.\ 14)$$

and the perturbation $$n_{RJ}(t/T_b) = -\sum_{k=-N_{pre}}^{N_{post}} \varepsilon_{RJ}(k)/T_b \cdot [b(k) - b(k-1)] \cdot h(t/T_b - k, b(k)) \quad (E.\ 15)$$

that is caused by the random jitter $\varepsilon_{RJ}(k)/T_b$. As shown above, the periodic jitter is not taken into account in the following. However, it might be taken into account if desired.

Figure 7B:
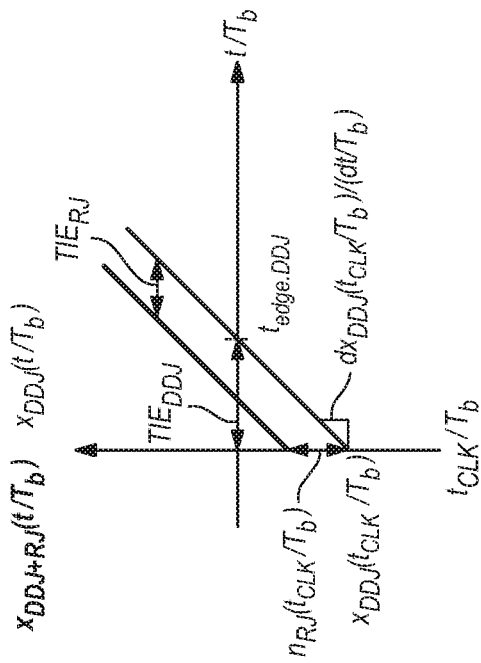
FIGS. 7a and 7b show two diagrams of jitter components plotted over time.
Figure 7A:
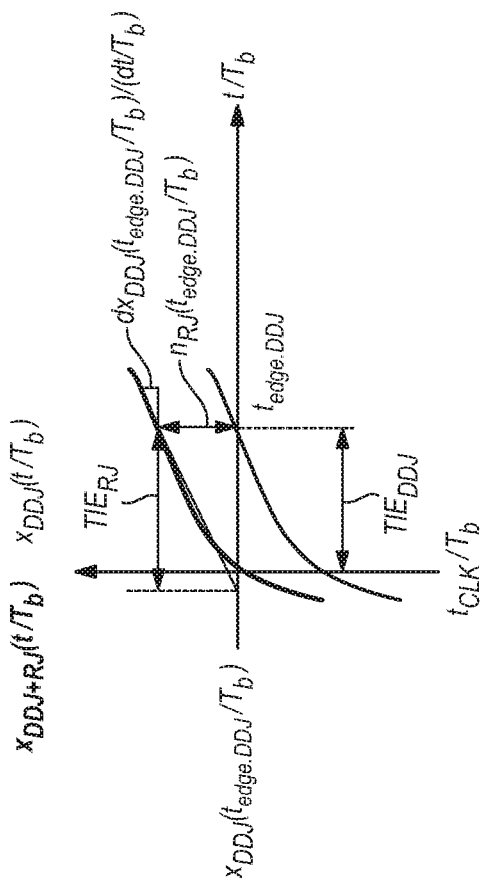

As can be seen from FIG. 7a, the time interval error $TIE_{RJ}$ that is associated with the random jitter $\varepsilon_{RJ}(k)/T_b$ is given by $$\frac{TIE_{RJ}(t_{edge}/T_b)}{T_b} \approx -\left[\frac{dx_{DDJ}(t_{edge}/T_b)}{d(t/T_b)}\right]^{-1} \cdot n_{RJ}(t_{edge}/T_b). \quad (E.\ 16)$$

In this approach the times $t_{edge}$ of the signal edges of the data dependent jitter signal $x_{DDJ}(t/T_b)$ are determined by the analysis module 20, for example based on the reconstructed data dependent jitter signal $\hat{x}_{DDJ}(t/T_b)$.

Alternatively, as depicted in FIG. 7b the clock times $t_{CLK}$ can be used that are known from the clock data recovery explained above (step S.4.1). In this case, the time interval error $TIE_{RJ}$ is given by $$\frac{TIE_{RJ}(t_{CLK}/T_b)}{T_b} \approx -\left[\frac{dx_{DDJ}(t_{CLK}/T_b)}{d(t/T_b)}\right]^{-1} \cdot n_{RJ}(t_{CLK}/T_b) \quad (E.\ 17)$$

In some embodiments, the clock times $t_{CLK}$ can be used provided that the slopes of the respective jitter signals, namely the data dependent jitter signal $x_{DDJ}(t/T_b)$ as well as the component $x_{DDJ+RJ}(t/T_b)$ of the input signal, are substantially equal as indicated in FIG. 7b.

The respective equations can be easily determined from the respective gradient triangle in FIGS. 7a, 7b.

In the following, the relation of equation (E.16) is used to derive the variance $\sigma_{\varepsilon_{RJ}}^2$. However, it is to be understood that the relation of equation (E.17) could be used instead.

Using equation (E.16), the autocorrelation function of the random jitter is given by $$r_{TIE_{RJ},TIE_{RJ}}(m) = E\{TIE_{RJ}(t_{edge}/T_b)/T_b \cdot TIE_{RJ}(t_{edge}/T_b + m)/T_b\} \approx \quad (E.\ 18)$$

$$E\left\{\left[\frac{dx_{DDJ}(t_{CLK}/T_b)}{d\left(\frac{t}{T_b}\right)}\right]^{-1} \cdot \left[\frac{dx_{DDJ}(t_{CLK}/T_b + m)}{d\left(\frac{t}{T_b}\right)}\right]^{-1} \cdot n_{RJ}(t_{CLK}/T_b) \cdot n_{RJ}(t_{CLK}/T_b + m)\right\}.$$

Therein and in the following, E {y} indicates an expected value of quantity y.

Figure 8:
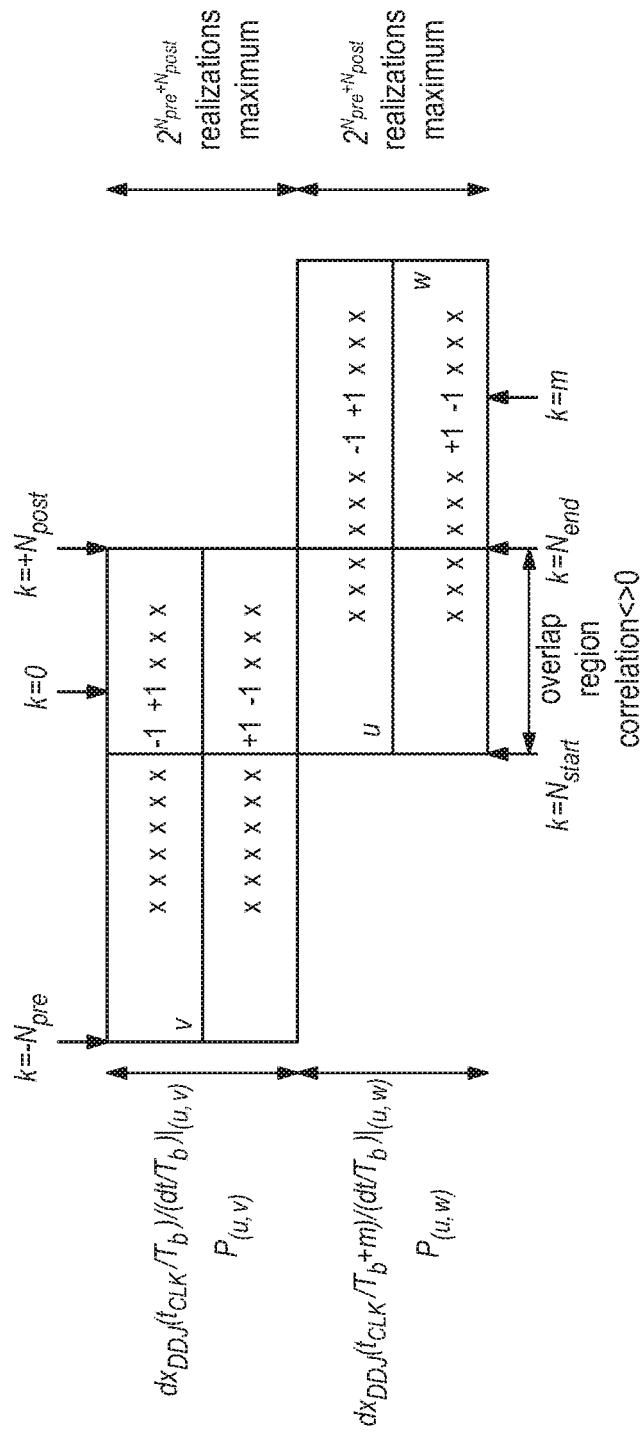
FIG. 8 shows a schematic representation of a method for determining an autocorrelation function of random jitter according to an embodiment of the disclosure.

The method for determining the autocorrelation function $r_{TIE_{RJ},TIE_{RJ}}$ is illustrated in FIG. 8.

The upper two rows in FIG. 8 represent a memory range of the transmission channel 26 with a bit change at time k=0. Accordingly, the lower two rows represent a memory range of the transmission channel 26 with a bit change at time k=m. Note that the example in FIG. 8 is for a PAM-2 coded input signal. However, the steps outlined in the following can readily be applied to a PAM-n coded input signal with appropriate combinatorial changes.

The memory range of the transmission channel 26 is $N_{pre}+N_{post}+1$. Thus, there are $2^{N_{pre}+N_{post}}$ possible permutations $\{b(k)\}$ of the bit sequence b(k) within the memory range.

The upper rows and the lower rows overlap in an overlap region starting at $k=N_{start}$ and ending at $k=N_{end}$. In the overlap region, the permutations of the bit sequences b(k) in the memory ranges of the upper and the lower rows have to be identical.

Note that only the overlap region contributes to the autocorrelation function.

In order to calculate the number of possible permutations in the overlap region, a case differentiation is made as follows:

The bit change at k=0 may be completely within the overlap region, completely outside of the overlap region or may overlap with the edge of the overlap region (i.e. one bit is inside of the overlap region and one bit is outside of the overlap region).

Similarly, the bit change at k=m may be completely within the overlap region, completely outside of the overlap region or may overlap with the edge of the overlap region (i.e. one bit is inside of the overlap region and one bit is outside of the overlap region).

Thus, there is a total of 3·3=9 cases that are taken into account.

Each permutation {b(k)} has a chance of P(u, v) for occurring and implies a particular slope $$dx_{DDJ}(t_{edge}/T_b)/d\left(\frac{t}{T_b}\right)\bigg|_{(u,v)}$$

of the data dependent jitter signal $x_{DDJ}(t_{edge}/T_b)$. Therein, u and v represent a particular realization of the bit sequence inside the overlap region and a particular realization of the bit sequence outside of the overlap region, respectively.

Now, the autocorrelation function of the perturbation $n_{RJ}(t_{edge}/T_b, k)$ for two particular realizations of the memory ranges at times k=0 and k=m leading to the particular realization u in the overlap region are determined. The conditional autocorrelation function of the perturbation $n_{RJ}$ ($t_{edge}/T_b$) is determined to be $$E\{n_{RJ}(t_{edge}/T_b) \cdot n_{RJ}(t_{edge}/T_b + m)\}|_u = \quad (E.19)$$

$$\sum_{k_0=-N_{pre}}^{N_{post}} \sum_{k_1=-N_{pre}}^{N_{post}} [b(k_0) - b(k_0 - 1)] \cdot$$

$$[b(k_1 + m) - b(k_1 - 1 + m)] \cdot h(t_{edge}/T_b - k_0, b(k_0)) \cdot$$

$$h(t_{edge}/T_b + m - k_1, b(k_1 + m)) \cdot E\{\varepsilon_{RJ}(k_0)/T_b \cdot \varepsilon_{RJ}(k_1 + m)/T_b\}$$

The temporal random jitter $\varepsilon_{RJ}(k)/T_b$ is normally distributed, for example stationary and normally distributed. Thus, the autocorrelation function for the temporal random jitter $\varepsilon_{RJ}(k)/T_b$ can be isolated since the other terms relate to deterministic contributions. In some embodiments, the autocorrelation function for the temporal random jitter $\varepsilon_{RJ}(k)/T_b$ is $$E\{\varepsilon_{RJ}(k_0)/T_b \cdot \varepsilon_{RJ}(k_1 + m)/T_b\} = \begin{cases} \sigma^2_{\varepsilon_{RJ}}/T_b^2 & k_0 = k_1 + m \\ 0 & \text{else} \end{cases} \quad (E.20)$$

Hence, the autocorrelation function for the temporal random jitter $\varepsilon_{RJ}(k)/T_b$ has only one contribution different from zero, namely for $k_0 = k_1 + m$. Accordingly, equation (E.19) becomes $$E\{n_{RJ}(t_{edge}/T_b) \cdot n_{RJ}(t_{edge}/T_b + m)\}|_u = \quad (E.21)$$

$$\frac{\sigma^2_{\varepsilon_{RJ}}}{T_b^2} \cdot \sum_{k=N_{start}}^{N_{end}} [b(k) - b(k-1)]^2 \cdot$$

$$h(t_{edge}/T_b - k, b(k)) \cdot h(t_{edge}/T_b + m - k, b(k)).$$

As already mentioned, only the overlap region has a contribution. Employing equation (E.21), the autocorrelation function of the random jitter is determined to be $$r_{TIE_{RJ},TIE_{RJ}}(m) \approx \sum_u E\{n_{RJ}(t_{edge}/T_b) \cdot n_{RJ}(t_{edge}/T_b + m)\}|_u \cdot \quad (E.22)$$

$$\sum_v \sum_w P((u,v) \cap (u,w)) \cdot \left[\frac{dx_{DDJ}(t_{edge}/T_b)}{d\left(\frac{t}{T_b}\right)}\bigg|_{(u,v)}\right]^{-1} \cdot$$

$$\left[\frac{dx_{DDJ}(t_{edge}/T_b + m)}{d\left(\frac{t}{T_b}\right)}\bigg|_{(u,w)}\right]^{-1},$$

wherein $P((u,v) \cap (u,w))$ is the joint probability density defined by $$P((u,v) \cap (u,w)) = \quad (E.23)$$

$$\frac{P(u,v) \cdot P((u,w)|(u,v)) = P(u,v) \cdot \frac{P(u,w)}{\Sigma_w P(u,w)}}{\Sigma_u P(u)}.$$

As can clearly be seen from equations (E.21) and (E.22), the autocorrelation function $r_{TIE_{RJ},TIE_{RJ}}(m)$ of the random jitter is linearly dependent on the variance $\sigma^2_{\varepsilon_{RJ}}$ of the random jitter.

Thus, the variance $\sigma^2_{\varepsilon_{RJ}}$ of the random jitter is determined as follows.

On one hand, the impulse response $h(t_{edge}/T_b - k, b(k))$ is already known or can be determined, as it is the time derivative of the determined step response $h_s(t/T_b - k, b(k))$ evaluated at time $t = t_{edge}$. Moreover, the bit sequence $b(k)$ is also known via the signal decoding procedure described above.

On the other hand, the time interval error $TIE_{RJ}(k)$ is known from the separation of the random jitter and the horizontal periodic jitter described above (step S.3.6) and the autocorrelation function can be also calculated from this directly.

Thus, the only unknown quantity in equations (E.21) and (E.22) is the variance $\sigma^2_{\varepsilon_{RJ}}$ of the random jitter, which can thus be determined from these equations.

Figure 9:
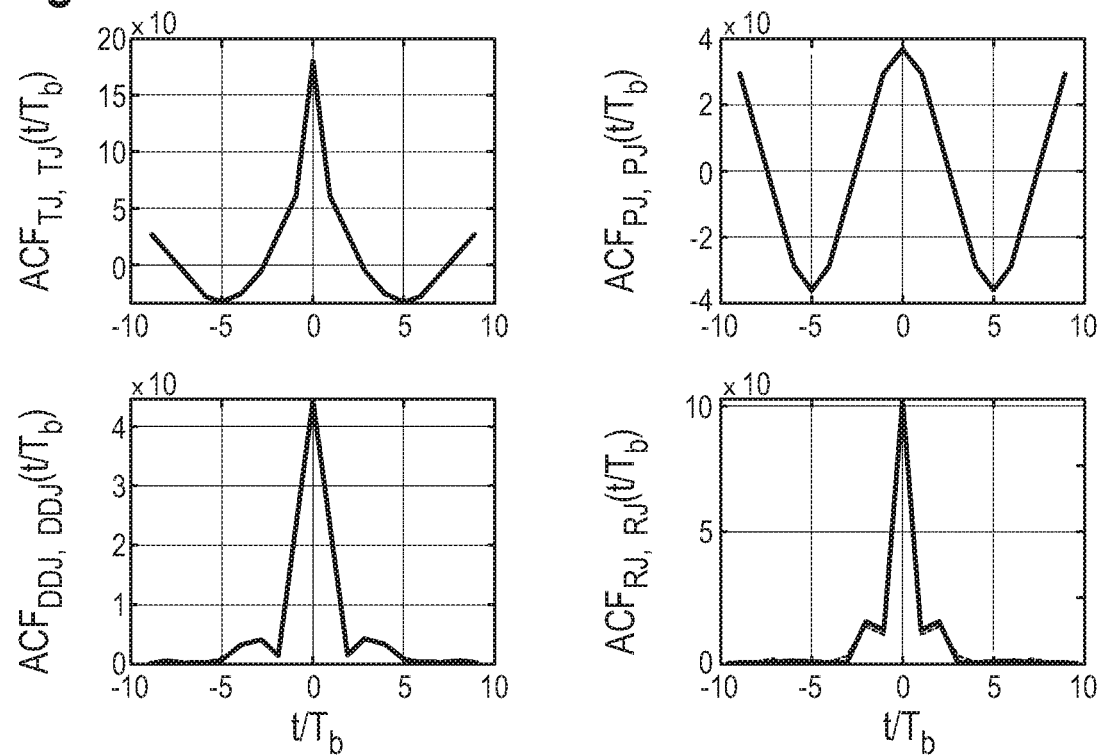
FIG. 9 shows an overview of different autocorrelation functions of jitter components.

As shown in FIG. 3 as well as FIG. 9, the autocorrelation function can be determined for any jitter component.

In FIG. 9, the autocorrelation functions for the total jitter signal, the periodic jitter signal, the data dependent jitter signal as well as the random jitter are shown.

Generally, the respective result may be displayed on the display 22.

Power Spectral Density

The power spectral density $R_{TIE,TIE}(f/f_b)$ of the time interval error is calculated based on the autocorrelation function by a Fourier series, which reads $$R_{TIE,TIE}(f/f_b) = \sum_{m=-L_{ACF}+1}^{+L_{ACF}-1} r_{TIE,TIE}(m) \cdot e^{-j \cdot 2\pi \cdot f/f_b \cdot m}. \quad (E.24)$$

The analysis module 20 may be configured to selectively determine the power spectral density $R_{TIE_{Jx},TIE_{Jx}}(m)$ of any jitter component Jx.

Moreover, the measurement instrument 12 may be configured to selectively display the power spectral density $R_{TIE_{Jx},TIE_{Jx}}(m)$ on the display 22.

Figure 10:
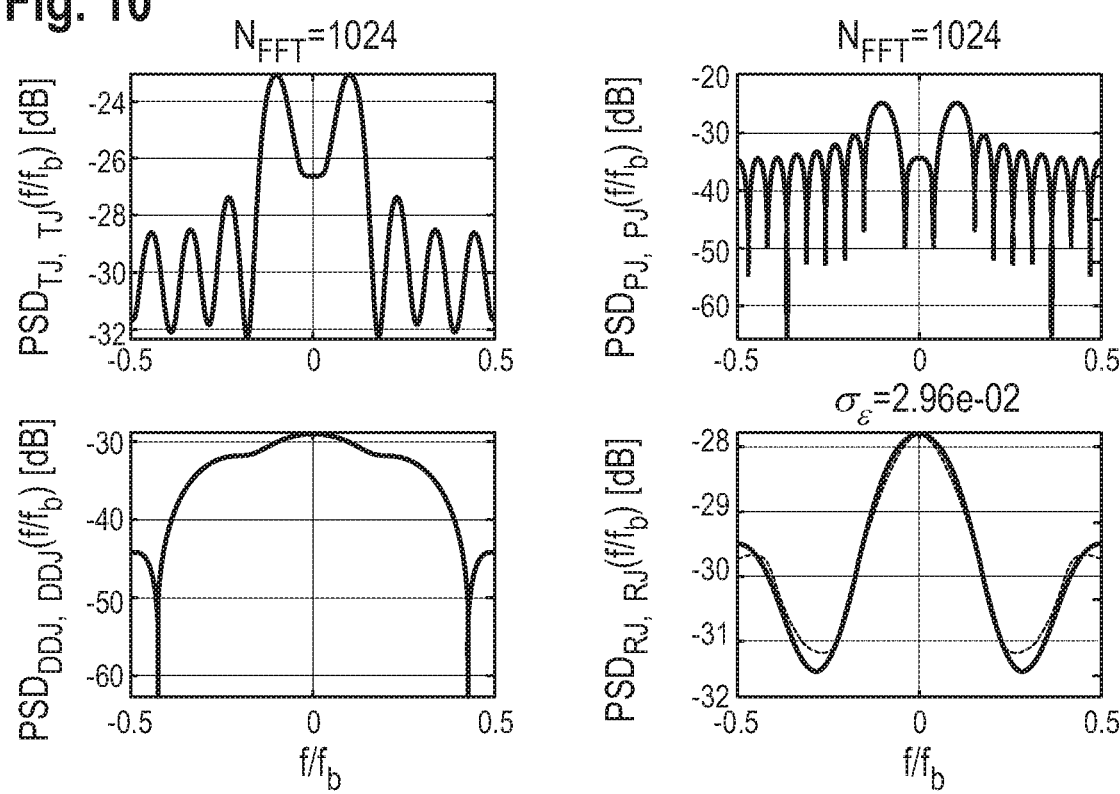
FIG. 10 shows an overview of different power spectrum densities of jitter components.

As shown in FIG. 3 as well as FIG. 10, the power spectral density can be determined for any jitter component.

In FIG. 10, the power spectral densities for the total jitter signal, the periodic jitter signal, the data dependent jitter signal as well as the random jitter are shown.

Generally, the respective result may be displayed on the display 22.

Bit Error Rate

The analysis module 20 is configured to determine the bit error rate $BER(t/T_b)$ that is caused by the time interval error $TIE_{DJ+RJ}$ being associated with the deterministic jitter and the random jitter, i.e. with the total jitter (step S.3.8).

A bit error occurs if the time interval error $TIE_{DJ}$ being associated with the deterministic jitter and the time interval error $TIE_{RJ}$ being associated with the random jitter fulfill one of the following two conditions:

$$\frac{t}{T_b} < TIE_{DJ} + TIE_{RJ}, \quad 0 \le \frac{t}{T_b} \le \frac{1}{2} \quad (E.25)$$

$$\frac{t}{T_b} > 1 + TIE_{DJ} + TIE_{RJ}, \quad \frac{1}{2} < \frac{t}{T_b} < 1$$

Thus, based on the histogram of the time interval error $TIE_{DJ}$ associated with deterministic jitter and based on the variance $\sigma_{RJ}^2$ of the time interval error $TIE_{RJ}$, the bit error rate $BER(t/T_b)$ is determined as follows for times $t/T_b < 1/2$:

$$BER\left(\frac{t}{T_b}\right) = \qquad (E.\ 26)$$

$$P_{rise} \cdot \sum_{i=0}^{N_{DJ,rise}-1} P_{DJx,rise}(i) \cdot \int_{\frac{t}{T_b}-TIE_{DJ,rise}(i)}^{\infty} \frac{1}{\sqrt{2\pi}\cdot\sigma_{RJ}} \cdot e^{\frac{-RJ^2}{2\sigma_{RJ}^2}} \cdot$$

$$dRJ + P_{fall} \cdot \sum_{i=0}^{N_{DJ,fall}-1} P_{DJx,fall}(i) \cdot$$

$$\int_{\frac{t}{T_b}-TIE_{DJ,fall}(i)}^{\infty} \frac{1}{\sqrt{2\pi}\cdot\sigma_{RJ}} \cdot e^{\frac{-RJ^2}{2\sigma_{RJ}^2}} \cdot dRJ =$$

$$\frac{P_{rise}}{2} \cdot \sum_{i=0}^{N_{DJ,rise}-1} P_{DJx,rise}(i) \cdot \mathrm{erfc}\left(\frac{\frac{t}{T_b}-TIE_{DJ,rise}(i)}{\sqrt{2}\cdot\sigma_{RJ}}\right) +$$

$$\frac{P_{fall}}{2} \cdot \sum_{i=0}^{N_{DJ,fall}-1} P_{DJx,fall}(i) \cdot \mathrm{erfc}\left(\frac{\frac{t}{T_b}-TIE_{DJ,fall}(i)}{\sqrt{2}\cdot\sigma_{RJ}}\right).$$

For times $1/2 < t/T_b < 1$, the bit error rate $BER(t/T_b)$ is determined to be $$BER\left(\frac{t}{T_b}\right) = \qquad (E.\ 27)$$

$$P_{rise} \cdot \sum_{i=0}^{N_{DJ,rise}-1} P_{DJx,rise}(i) \cdot \int_{-\infty}^{\frac{t}{T_b}-TIE_{DJ,rise}(i)-1} \frac{1}{\sqrt{2\pi}\cdot\sigma_{RJ}} \cdot e^{\frac{-RJ^2}{2\sigma_{RJ}^2}} \cdot$$

$$dRJ + P_{fall} \cdot \sum_{i=0}^{N_{DJ,fall}-1} P_{DJx,fall}(i) \cdot$$

$$\int_{-\infty}^{\frac{t}{T_b}-TIE_{DJ,fall}(i)-1} \frac{1}{\sqrt{2\pi}\cdot\sigma_{RJ}} \cdot e^{\frac{-RJ^2}{2\sigma_{RJ}^2}} \cdot dRJ = P_{rise} \cdot$$

$$\sum_{i=0}^{N_{DJ,rise}-1} P_{DJx,rise}(i) \cdot \left[1 - \frac{1}{2}\mathrm{erfc}\left(\frac{\frac{t}{T_b}-TIE_{DJ,rise}(i)-1}{\sqrt{2}\cdot\sigma_{RJ}}\right)\right] +$$

$$P_{fall} \cdot$$

$$\sum_{i=0}^{N_{DJ,fall}-1} P_{DJx,fall}(i) \cdot \left[1 - \frac{1}{2}\mathrm{erfc}\left(\frac{\frac{t}{T_b}-TIE_{DJ,fall}(i)-1}{\sqrt{2}\cdot\sigma_{RJ}}\right)\right].$$

Therein, $P_{rise}$ and $P_{fall}$ are the probabilities of a rising signal edge and of a falling signal edge, respectively. $N_{DJ,rise}$ and $N_{DJ,fall}$ are the numbers of histogram containers of the deterministic jitter for rising signal edges and for falling signal edges, respectively. Correspondingly, $TIE_{DJ,rise}(i)$ and $TIE_{DJ,fall}$ are the histogram values of the deterministic jitter for rising signal edges and for falling signal edges, respectively.

Thus, the bit error rate $BER(t/T_b)$ is calculated based on the histogram of the deterministic jitter and based on the variance of the random jitter rather than determined directly by measuring the number of bit errors occurring within a certain number of bits.

Generally spoken, the bit error rate $BER(t/T_b)$ is determined based on the respective time interval error used for deriving at the corresponding histogram.

This way, the bit error rate can also be determined in regions that are not accessible via direct measurements or that simply take a too long time to measure, for example for bit error rates $BER(t/T_b) < 10^{-6}$.

In some embodiments, bit error rates smaller than $10^{-8}$, smaller than $10^{-10}$ or even smaller than $10^{-12}$ can be determined employing the method described above.

In order to linearize the curves describing the bit error rate, a mathematical scale transformation $Q(t/T_b)$ may be applied to the bit error rate, which is, at least for the case of $P_{rise} + P_{fall} = 0.5$, given by:

$$Q(t/T_b) = \sqrt{2}\cdot\mathrm{erf}^{-1}(1 - 2\cdot BER(t/T_b)) \qquad (E.28)$$

Instead of employing the histogram of the complete deterministic jitter, a histogram corresponding to at least one of the components of the deterministic jitter may be employed. Put differently, one or more of the components of the deterministic jitter may be selectively suppressed and the corresponding change of the bit error rate may be determined. This is also shown in FIG. 3.

More precisely, one of or an arbitrary sum of the data dependent jitter, the other bounded uncorrelated jitter, the horizontal periodic jitter and the vertical periodic jitter may be included and the remaining components of the deterministic jitter may be suppressed.

For instance, the bit error rate $BER(t/T_b)$ is determined based on the histogram related to data dependent jitter, the histogram related to data dependent jitter and periodic jitter or the histogram related to data dependent jitter and other bounded uncorrelated jitter.

Moreover, the horizontal and vertical components may be selectively taken into account. In some embodiments, the precision or rather accuracy may be improved.

Analogously, only the variance of the vertical random jitter or of the horizontal random jitter may be employed instead of the variance of the complete random jitter such that the other one of the two random jitter components is suppressed and the effect of this suppression may be determined.

The respective histograms may be combined in any manner Hence, the periodic jitter may be obtained by subtracting the data dependent jitter from the deterministic jitter.

Depending on which of the deterministic jitter components is included, the final result for the bit error rate $BER(t/T_b)$ includes only the contributions of these deterministic jitter components.

Thus, the bit error rate $BER(t/T_b)$ corresponding to certain jitter components can selectively be determined.

Figure 11:
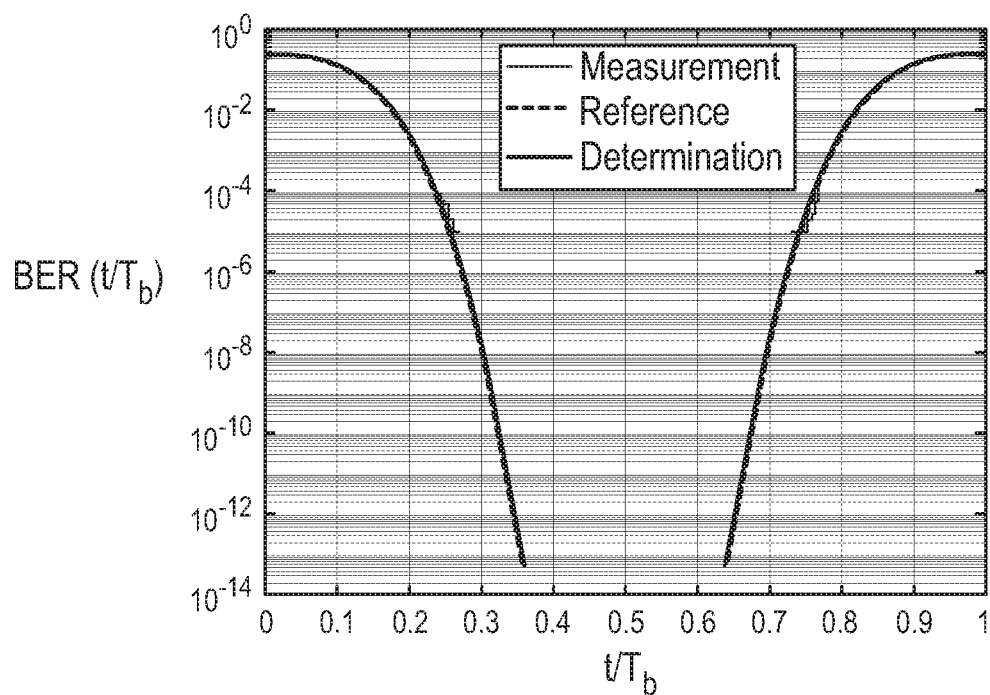
FIG. 11 shows an overview of a bit error rate determined, a measured bit error rate and a reference bit error rate.

The determined bit error rate $BER(t/T_b)$ may be displayed on the display 22 as shown in FIG. 11.

In FIG. 11, a measured bit error rate as well as a bit error rate estimated with methods known in the prior art are also shown.

Figure 12:
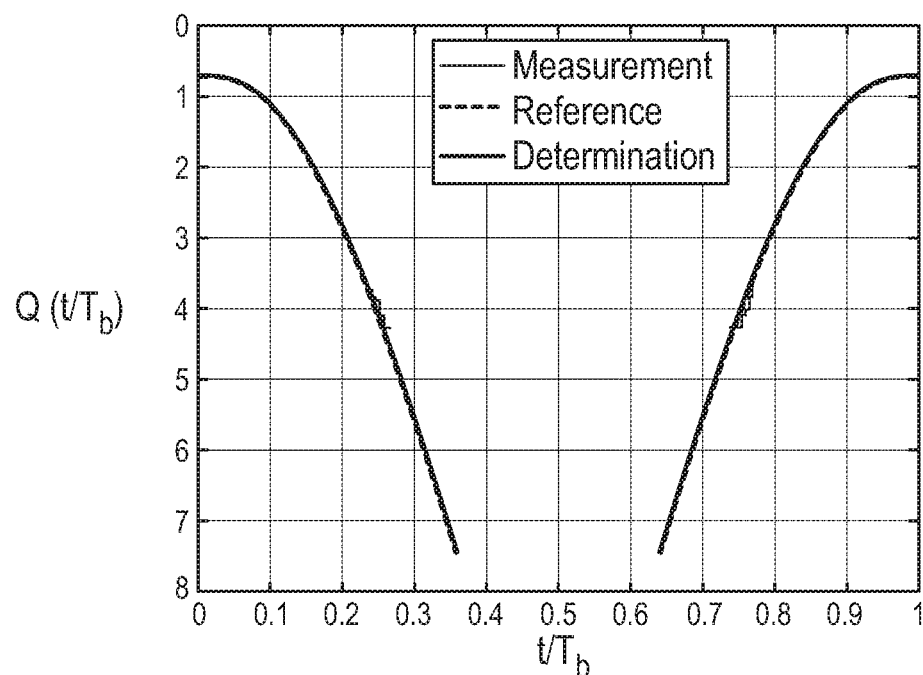
FIG. 12 shows an overview of a mathematical scale transformation of the results of FIG. 11.

In FIG. 12, the respective mathematical scale transformation is shown that may also be displayed on the display 22.

In some embodiments, a bit error rate BER(t/$T_b$) containing only certain deterministic jitter components may be displayed on the display 22, wherein a user may choose which of the deterministic jitter components are included. Moreover, the fraction of the complete bit error rate that is due to the individual jitter components may be determined and displayed on the display 22.

Note that if the individual histograms of two statistically independent components $TIE_0$ and $TIE_1$ of the time interval error TIE are known, the resulting collective histogram containing both components can be determined by a convolution of the two individual histograms:

$$f_{TIE_0+TIE_1}(TIE_0 + TIE_1) = \sum_{\xi=-\infty}^{+\infty} f_{TIE_0}(\xi) \cdot f_{TIE_1}(TIE_0 + TIE_1 - \xi). \quad (E.29)$$

As mentioned already, the deterministic jitter and the random jitter are statistically independent from each other.

Thus, the histogram of the time interval error related to total jitter may be determined by convolution of the histograms of the time interval errors related to deterministic jitter and random jitter.

Joint Random Jitter and Random Noise Analysis

The analysis module 20 is configured to separate the vertical random noise and the horizontal random jitter contained within the input signal.

More precisely, the analysis module is configured to perform a joint random jitter and random noise analysis of the input signal in order to separate and/or determine the vertical random noise and the horizontal random jitter.

First, the determined data dependent jitter signal $x_{DDJ}$(t/$T_b$), which is determined in step S.4.4, and the determined vertical periodic noise signal $x_{PN(v)}$ (step S.3.2) are subtracted from the input signal, labelled in the following by $x_{TJ}$(t/$T_b$), thereby generating a perturbation signal $n_0$(t/$T_b$), which is determined to be $$n_0(t/T_b) = x_{TJ}(t/T_b) - x_{DDJ}(t/T_b) - x_{PN(v)}(t/T_b) = \quad (E.30)$$
$$- \sum_{k=-N_{pre}}^{N_{post}} \varepsilon(k)/T_b \cdot [b(k) - b(k-1)] \cdot h(t/T_b - k, b(k)) +$$
$$x_{RN(v)}(t/T_b).$$

The perturbation signal $n_0$(t/$T_b$) approximately only contains horizontal random jitter, vertical random noises $x_{RN(v)}$(t/$T_b$) and horizontal periodic jitter, wherein the temporal jitter $$\varepsilon(k)/T_b = \varepsilon_{PJ}(k)/T_b + \varepsilon_{RJ}(k)/T_b = \quad (E.31)$$
$$\sum_{i=0}^{N_{PJ(h)}-1} a_i/T_b \cdot \sin(2\pi \cdot \vartheta_i/f_b \cdot k + \varphi_i) + \varepsilon_{RJ}(k)/T_b$$

approximately only contains horizontal random jitter and horizontal periodic jitter.

As already mentioned, more than a single bit period may be taken into account.

The next step performed by the analysis module 20 is to determine the horizontal periodic jitter components.

For this purpose, a time variant equalizer filter $\hat{h}_e$(k, t/$T_b$) is applied to the perturbation signal $n_0$(t/$T_b$). The time variant equalizer filter $\hat{h}_e$(k, t/$T_b$) is determined from a time variant equalizer filter $\tilde{h}_e$(k, t/$T_b$) that is defined by:

$$\tilde{h}_e(k,t/T_b) = [b(-k) - b(-k+1)] \cdot h(k - t/T_b, b(k)). \quad (E.32)$$

More precisely, the time variant equalizer filter is determined by minimizing the following cost functional K, for example by applying a least mean squares approach:

$$K = \sum_{f/f_b} \left| \frac{1}{\tilde{H}_e(f/f_b)} - \sum_k \hat{h}_e(k) \cdot e^{-j2\pi \cdot f/f_b \cdot k} \right|^2 \quad (E.33)$$

Therein, $\tilde{H}_e$(f/$f_b$) is the Fourier transform of the time variant equalizer filter $\tilde{h}_e$(k, t/$T_b$). Of course, this analysis could also be performed in time domain instead of the frequency domain as in equation (E.33).

The resulting time variant equalizer filter is then applied to the perturbation signal $n_0$(t/$T_b$) such that a filtered perturbation signal is obtained, which is determined to be $$\tilde{n}_0(k, t/T_b) = \varepsilon_{PJ}(k)/T_b + \varepsilon_{RJ}(k)/T_b = \sum_k \hat{h}_e(k, t/T_b) \cdot n_0(t/T_b - k) = \quad (E.34)$$
$$\sum_{i=0}^{N_{PJ(h)}-1} a_i/T_b \cdot \sin(2\pi \cdot \vartheta_i/f_b \cdot k + \varphi_i) + \varepsilon_{RJ(h),RN(v)}(k)/T_b,$$

Now, the frequencies $\vartheta_i$ and the phases $\varphi_i$ are roughly estimated at first and then the amplitudes $\hat{a}_i$, the frequencies $\hat{\vartheta}_i$ and the phases $\hat{\varphi}_i$ are determined jointly. For this purpose, the following cost functional $$K = \sum_{t/T_b} \left[ n_0(t/T_b) + \sum_{k=-N_{pre}}^{N_{post}} \sum_{i=0}^{N_{PJ(h)}-1} \frac{\hat{a}_i}{T_b} \cdot \sin(2\pi \cdot \vartheta_i/f_b \cdot k + \varphi_i) \cdot \right. \quad (E.35)$$
$$\left. [b(k) - b(k-1)] \cdot h(t/T_b - k, b(k)) \right]^2$$

is minimized analogously to the joint parameter analysis method outlined above that corresponds to step S.3.2, shown in FIG. 3.

If there is no duty cycle distortion or if the duty cycle distortion present in the input signal is much smaller than the horizontal periodic jitter, a time invariant equalizer filter $\tilde{h}_e$(k, t/$T_b$)=h(k−t/$T_b$) may be used for determining the time invariant equalizer filter $\hat{h}_e$(k,t/$T_b$).

In this case, the filtered perturbation signal $$\tilde{n}_0(k, t/T_b) = [b(k) - b(k-1)] \cdot \varepsilon_{PJ}(k)/T_b + \varepsilon_{RJ}(k)/T_b = \quad (E.36)$$
$$\sum_k \hat{h}_e(k, t/T_b) \cdot n_0(t/T_b - k) = [b(k) - b(k-1)] \cdot$$
$$\sum_{i=0}^{N_{PJ(h)}-1} a_i/T_b \cdot \sin(2\pi \cdot \vartheta_i/f_b \cdot k + \varphi_i) + \varepsilon_{RJ(h),RN(v)}(k)/T_b,$$

still comprises a modulation $[b(k)-b(k-1)]$ that is due to the bit sequence, which is however known and is removed before roughly estimating the frequencies $\vartheta_i$ and the phases $\varphi_i$.

With the determined amplitudes $\hat{a}_i$, the determined frequencies $\hat{\vartheta}_i$ and the determined phases $\hat{\varphi}_i$, the horizontal periodic jitter signal is now reconstructed to be $$\hat{x}_{PJ(h)}(t/T_b) = -\sum_{k=-N_{pre}}^{N_{post}} \sum_{i=0}^{N_{PJ(h)}-1} \hat{a}_i/T_b \cdot \sin(2\pi \cdot \hat{\vartheta}_i/f_b \cdot k + \hat{\varphi}_i) \cdot \quad \text{(E. 37)}$$

$$[b(k)-b(k-1)] \cdot h(t/T_b-k, b(k)).$$

Based on the reconstructed horizontal periodic jitter signal, a random perturbation signal $n_1(t/T_b)$ is determined by subtracting the reconstructed horizontal periodic jitter signal shown in equation (E.37) from the perturbation signal. The determined random perturbation signal reads $$n_1(t/T_b) = n(t/T_b) - \hat{x}_{PJ(h)}(t/T_b) \approx \quad \text{(E. 38)}$$

$$-\sum_{k=-N_{pre}}^{N_{post}} \varepsilon_{RJ}(k)/T_b \cdot [b(k)-b(k-1)] \cdot h(t/T_b-k, b(k)) +$$

$$x_{RN(v)}(t/T_b)$$

and contains approximately only horizontal random jitter represented by the first term in the second line of equation (E.38) and vertical random noise represented by the second term in the second line of equation (E.38).

Generally speaking, the analysis module 20 now applies a statistical method to the signal of equation (E.38) at two different times in order to determine two statistical moments that are associated with the horizontal random jitter and with the vertical random noise, respectively.

More specifically, the analysis module 20 determines the variances $\sigma_{RJ(h)}^2$ and $\sigma_{RN(v)}^2$ that are associated with the horizontal random jitter and with the vertical random noise, respectively, based on equation (E.38). Note that both the horizontal random jitter and the vertical random noise are normal-distributed. Further, they are statistically independent from each other.

According to a first variant, the conditional expected value of $n_1^2(t/T_b)$ for a particular realization $(u,v)$ of the memory range is used and is determined to be $$E\{n_1^2(t/T_b)\}|_{(u,v)} \approx \frac{\sigma_{\varepsilon_{RJ}}^2}{T_b^2} \cdot \sum_{i=0}^{N-1} P_{(u_i,v_i)} \cdot \sum_{k=-N_{pre}}^{N_{post}} [b(k)-b(k-1)]^2 \cdot \quad \text{(E. 39)}$$

$$h^2(t/T_b-k, b(k))|_{(u_i,v_i)} + \sigma_{RN(v)}^2.$$

Therein, $P_{(u_i,v_i)}$ is the probability of the permutation $(u_i, v_i)$. N is the number of permutations that are taken into account. Thus, the accuracy and/or the computational time can be adapted by varying N. For example, a user may choose the number N.

According to a second variant, all possible permutations $(u_i, v_i)$ are taken into account in equation (E.39), such that an unconditional expected value of $n_1^2(t/T_b)$ is obtained that reads $$E\{n_1^2(t/T_b)\} \approx \frac{\sigma_{\varepsilon_{RJ}}^2}{T_b^2} \cdot \sum_{k=-N_{pre}}^{N_{post}} P_r \cdot 2^2 \cdot h_r^2(t/T_b-k) + \quad \text{(E. 40)}$$

$$P_f \cdot 2^2 \cdot h_f^2(t/T_b-k) + \sigma_{RN(v)}^2,$$

Therein, $P_r$ and $P_f$ are the probabilities for a rising signal flank and for a falling signal flank, respectively.

If there is no duty cycle distortion present or if the duty cycle distortion is very small, equation (E.39) simplifies to $$E\{n_1^2(t/T_b)\} \approx \quad \text{(E. 41)}$$

$$\frac{\sigma_{\varepsilon_{RJ}}^2}{T_b^2} \cdot [2E\{b^2(k)\} - 2E\{b(k) \cdot b(k-1)\}] \cdot \sum_{k=-N_{pre}}^{N_{post}} h^2(t/T_b-k) +$$

$$\sigma_{RN(v)}^2.$$

The analysis module 20 is configured to determine the variances $\sigma_{RJ(h)}^2$ and $\sigma_{RN(v)}^2$ based on at least one of equations (E.39) to (E.41). More precisely, the respective equation is evaluated for at least two different times $t/T_b$. For example, the signal edge time $t_0/T_b=0$ and the time $t_1/T_b=\frac{1}{2}$ may be chosen.

As everything except for the two variances is known in equations (E.39) to (E.41), the variances $\sigma_{RJ(h)}^2$ and $\sigma_{RN(v)}^2$ are then determined from the resulting at least two equations. It is to be noted that the variances $\sigma_{RJ(h)}^2$ and $\sigma_{RN(v)}^2$ correspond to the respective standard deviations.

In order to enhance accuracy, the equations can be evaluated at more than two times and fitted to match the measurement points in an optimal fashion, for example by applying a least mean squares approach.

Alternatively or additionally, only the variance $\sigma_{RN(v)}^2$ may be determined from the equations above and the variance $\sigma_{RJ(v)}^2$ may be determined from the following relation $$\sigma_{RJ(v)}^2/T_b^2 = \sigma_{RN(v)}^2 \cdot \sum_i P_i \cdot \left[\frac{1}{dx_{DDJi}(t_{edge}/T_b)/(dt/T_b)}\right]^2 \quad \text{(E. 42)}$$

As the horizontal random jitter and the vertical random jitter are statistically independent, the variance $\sigma_{RJ(h)}^2$ is then determined to be $$\sigma_{RJ(h)}^2/T_b^2 = \sigma_{RJ}^2/T_b^2 - \sigma_{RJ(v)}^2/T_b^2 \quad \text{(E.43)}$$

Therein, $P_i$ is the probability that a signal edge with slope $dx_{DDJ_i}(t_{edge}/T_b)/(dt/T_b)$ arises. The numerical complexity of this method can be reduced by only taking into account substantially different slopes to contribute to the sum of equation (E.42).

Separation of Random Jitter and Other Bounded Uncorrelated Jitter

The analysis module 20 is further configured to determine a probability density $f_{X_0}(x_0)$ of a Gaussian random variable, for instance the random jitter, and a probability density $f_{X_1}(x_1)$ of a non-Gaussian bounded random variable, for instance the other bounded uncorrelated jitter.

For instance, the separation of the random jitter and other bounded uncorrelated jitter may be done by modelling the random jitter $x_0$ with a standard deviation $\sigma_{RJ}$ whereas the other bounded uncorrelated jitter $x_1$ is random having the probability density $f_{x_1}(x_i.)$ The probability distribution may read as follows $$F_x(x) = P_0 \cdot \left[1 - \frac{1}{2}\mathrm{erfc}\left(\frac{x-\mu_0}{\sqrt{2}\cdot\sigma}\right)\right] + P_1 \cdot \left[1 - \frac{1}{2}\mathrm{erfc}\left(\frac{x-\mu_1}{\sqrt{2}\cdot\sigma}\right)\right].$$

A mathematical scale transformation $Q_x(x)$ as already described may be applied so that $$Q_x(x) = \mathrm{erfc}^{-1}\left(2 - 2\cdot(P_0 + P_1) + P_0 \cdot \mathrm{erfc}\left(\frac{x-\mu_0}{\sqrt{2}\cdot\sigma}\right) + P_1 \cdot \mathrm{erfc}\left(\frac{x-\mu_1}{\sqrt{2}\cdot\sigma}\right)\right)$$

is obtained, wherein the line obtained by the mathematical scale transformation may correspond to $$Q_x(x)\Big|_{left} \approx \frac{x-\mu_0}{\sqrt{2}\cdot\sigma}, \text{ and } Q_x(x)\Big|_{right} \approx \frac{x-\mu_1}{\sqrt{2}\cdot\sigma}$$

for respective ends of the mathematical scale transformation.

The standard deviation $\sigma$ and the parameters $\mu_0, \mu_1$ may be determined.

The standard deviation $\sigma$ may also be determined differently, for instance as already described above.

In the input signal, the random jitter and the other bounded uncorrelated jitter are superposed. Therefore, a collective probability density $f_x(x)$ is given by a convolution of the individual probability densities with $x=x_0+x_1$, i.e.

$$f_x(x) = \int_{-\infty}^{+\infty} f_{x_0}(\xi)\cdot f_{x_1}(x-\xi)\cdot d\xi \quad (E.\ 43)$$

Transformed into frequency domain, the convolution of equation (E.43) becomes a mere product. The Fourier transform $f_{x_0}(f/f_a)$, i.e. the spectrum of the random jitter probability density $f_{x_0}(x_0)$, is normal distributed and reads:

$$F_{x_0}(f/f_a) = e^{-2\pi^2\sigma^2\left(\frac{f}{f_a}\right)^2}. \quad (E.\ 44)$$

This property is employed in the separation of the random jitter component and the other bounded uncorrelated jitter component.

For example, the spectrum is determined based on measurements of the input signal and by matching the function of equation (E.44) to the measurement data.

Figure 13:
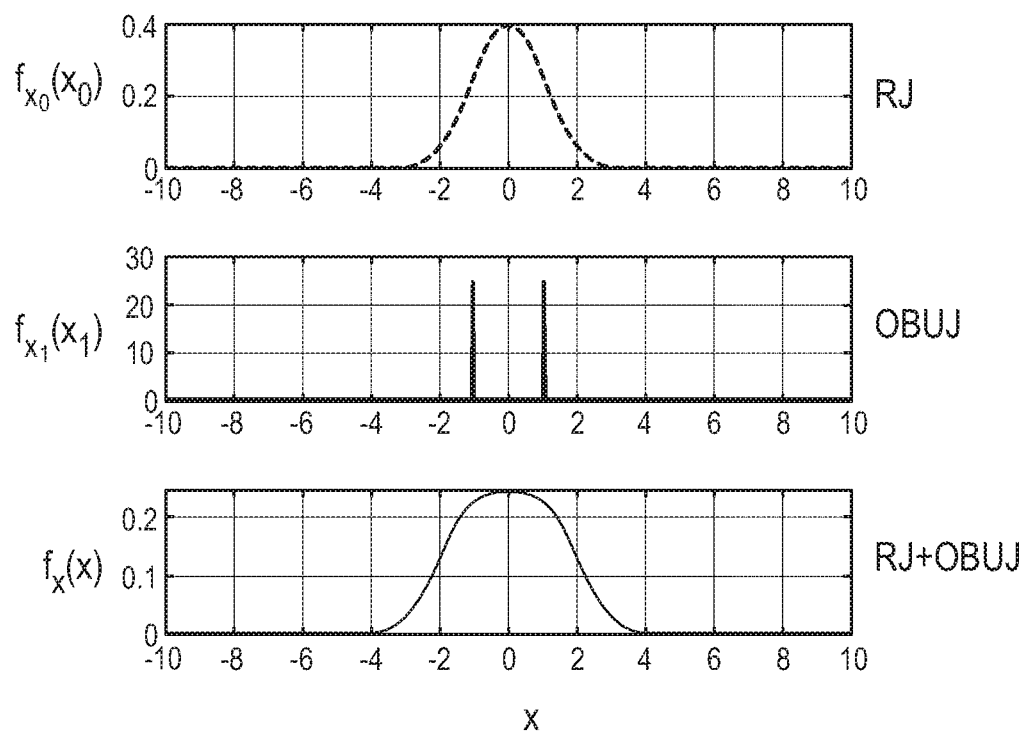
FIG. 13 shows an overview of probability densities of the random jitter, the other bounded uncorrelated jitter as well as a superposition of both.

In FIG. 13, an overview is shown wherein the probability densities of the random jitter, the other bounded uncorrelated jitter as well as a superposition of both are illustrated.

Alternatively or additionally, the variance $\sigma_{RJ}^2$ of the random jitter may already be known from one of the steps described above.

The probability density of the random jitter component is then determined to be $$\hat{f}_{x_0}(x_0) = \frac{1}{\sqrt{2\pi}\cdot\hat{\sigma}}\cdot e^{-\frac{x_0^2}{2\hat{\sigma}^2}} \quad (E.\ 45)$$

Based on the result of equation (E.45), the probability density $f_{x_1}(x_1)$ of the other bounded uncorrelated jitter component is then determined by a deconvolution of equation (E.43).

This is achieved by minimizing the following cost functional K, for example via a least mean squares approach:

$$K = \sum_{x=x_{min}}^{x_{max}}\left[f_x(x) - \sum_{\xi=x_{1,min}}^{x_{1,max}}\hat{f}_{x_1}(\xi)\cdot\hat{f}_{x_0}(x-\xi)\right]^2. \quad (E.\ 46)$$

Thus, the histogram of the other bounded uncorrelated jitter component can be determined.

Accordingly, histograms of all jitter components may be determined as already mentioned and shown in FIG. 3.

One possible method for separating the RJ component and the OBUJ component of the input signal is described above. However, it is to be understood that the random noise (RN) component and the OBU noise (OBUN) component of the input signal can be separated analogously with the method described above.

In the following, a second, slightly different approach for separating the RJ component and the OBUJ component, and/or for separating the RN component and the OBUN component is described.

Generally, the term "perturbance" is used to exclusively denote either jitter or noise.

Accordingly, the signal analysis methods described in the following may be performed in order to determine a OBUJ probability density function being associated with the other bounded uncorrelated jitter component, and/or in order to determine an OBUN probability density function being associated with the other bounded uncorrelated noise component.

In order to more clearly distinguish the method described in the following from the method described above, a different nomenclature is used for the probability density functions. For example, $p_{R+OBU}(t)$ is used to denote either the collective RJ and OBUJ probability density function, or the collective RN and OBUN probability density function, wherein "probability density function" may be abbreviated as "PDF" in the following.

Moreover, the term "random perturbance" may be abbreviated as "RP", and the term "other bounded uncorrelated perturbance" may be abbreviated as "OBUP" in the following.

Without loss of generality, the PDF parameter is chosen to be the time t, although both jitter and noise PDFs are considered.

The collective perturbance PDF of the sum of the RP and the OBUP component is given by the continuous-time convolution $$p_{R+OBU}(t) = \int_{-\infty}^{\infty} p_{OBU}(u) p_R(t-u) du. \qquad (E.\ 47)$$

Since the random perturbance component is (or is assumed to be) Gaussian, the frequency transform of its PDF is approximately bandlimited. It is thus possible to find a suitable sampling of $p_R(t)$ with $T_R \leq T_{R,max}$, where $T_{R,max}$ represents a maximum (largest acceptable) sampling period.

Using $T=T_R/N$ for some integer $N \geq 1$, (E.47) can be rewritten as $$p_{R+OBU}(kT+T_0) \approx \qquad (E.\ 48)$$

$$\int_{-\infty}^{\infty} p_{OBU}(u) \sum_{l=-\infty}^{+\infty} p_R(lT_R) \operatorname{sinc}\left(\frac{kT+T_0-u-lT_R}{T_R}\right) du =$$

$$\sum_{l=-\infty}^{+\infty} p_R(lT_R) \int_{-\infty}^{\infty} p_{OBU}(u) \operatorname{sinc}\left(\frac{k}{N}-l+\frac{T_0}{T_R}-\frac{u}{T_R}\right) du.$$

Therein, $T_0$ is a time offset, as there might be no sample point at $t=0$. Using the bandlimited OBUP PDF $$\tilde{p}_{OBU}(t) = \frac{1}{T_R} \int_{-\infty}^{\infty} p_{OBU}(u) \operatorname{sinc}\left(\frac{t-u}{T_R}\right) du, \qquad (E.\ 49)$$

the discrete-time OBUP PDF can be defined as $$p_{OBU}[k] = \tilde{p}_{OBU}(kT+T_0). \qquad (E.50)$$

Furthermore, the discrete-time random perturbance PDF can be defined as $$p_R[k] = p_R(kT_R). \qquad (E.51)$$

Now, the discrete-time RP+OBUP PDF $p_{OBU+R}[k] \approx p_{OBU+R}(kT+T_0)$ can be defined using the following discrete-time convolution:

$$p_{R+OBU}[k] = T_R \sum_{l=-\infty}^{+\infty} p_R[l] p_{OBU}[k-lN]. \qquad (E.\ 52)$$

It is noted that the discrete-time OBUP PDF is not equal to the sampled continuous-time OBUP PDF that is unbounded in frequency. Instead, the discrete-time OBUP PDF corresponds to the samples of a low-pass-filtered continuous-time OBUP PDF. Although any continuous-time PDF is non-zero by definition, this is only strictly true for a discrete-time PDF that is based on a sufficiently bandlimited continuous-time PDF.

In some applications, the PDF itself may not be available during the analysis of the input signal. Instead, (possibly normalized) histograms of the perturbance component(s) may be available.

For example, a RP+OBUP histogram bin probability $P_{R+OBU}(kT+T_0)$ may be available, which is given by $$P_{R+OBU}(kT+T_0) = \qquad (E.\ 53)$$

$$\int_{-T/2}^{T/2} p_{R+OBU}(kT+T_0+u) du \approx \sum_{l=-\infty}^{+\infty} p_R(lT_R) \int_{-\infty}^{\infty}$$

$$p_{OBU}(v) \int_{-\frac{T}{2}}^{\frac{T}{2}} \operatorname{sinc}\left(\frac{k}{N}-l+\frac{T_0}{T_R}+\frac{u-v}{T_R}\right) du dv =$$

$$T_R \sum_{l=-\infty}^{+\infty} p_R(lT_R) \int_{-\frac{T}{2}}^{\frac{T}{2}} \tilde{p}_{OBU}(kT-lT_R+T_0+u) du =$$

$$T_R \sum_{l=-\infty}^{+\infty} p_R(lT_R) \tilde{P}_{OBU}(kT-lT_R+T_0).$$

Therein, $\tilde{P}_{OBU}$ is given by $$\tilde{P}_{OBU}(t) = \int_{-T/2}^{T/2} \tilde{p}_{OBU}(t+u) du, \qquad (E.\ 54)$$

or, for $T \ll T_{R,max}$, by $$P_{R+OBU}(kT+T_0) \approx T p_{R+OBU}[k]. \qquad (E.55)$$

Without restriction of generality, N=1 and $T \ll T_{R,max}$ are assumed in the following. Moreover, in order to simplify notation, the following length-L vectors are defined:

$$[p_{R+OBU}]_{k-k_{min}} = p_{R+OBU}[k]$$

$$[p_R]_{k-k_{min}} = p_R[k]$$

$$[p_{OBU}]_{k-k_{min}} = p_{OBU}[k] \qquad (E.56)$$

Without restriction of generality, the same length L is chosen for all vectors in equation (E.56). However, it is to be understood that the vectors may have different lengths.

Similar to the method for separating the OBUJ component and the RJ component described above, the OBUP and the RP components can be separated from one another by first determining the standard deviation $\sigma_R$ of the RP, and then performing a deconvolution of the RP PDF and the OBUP PDF.

In order to determine the standard deviation $\sigma_R$ of the RP component, a cumulative collective probability density function ("CDF" in the following) $c_{R+OBU}$ being associated with both the RP component and the OBUP component is transformed via a mathematical scale transformation.

More precisely, the following mathematical scale transformation is performed (which may also be referred to as a transformation to Q-space):

$$q_{R+OBU} = \operatorname{erfc}^{-1}(2 - 2c_{R+OBU}) \qquad (E.57)$$

Then, appropriate samples are extracted from $q_{R+OBU}$, i.e. samples at positions where the linear shape from a Gaussian distribution is observed, but the values are not too noisy.

These samples are located at $N_l$ positions at low CDF values and $N_h$ positions at high CDF values, wherein $N_l$ and $N_h$ are integers bigger than zero.

The standard deviation of the Gaussian RP PDF is finally obtained by solving the following constrained least-squares problem:

$$\min_{x} \|\check{q}_{R+OBU} - Ax\|_2^2 \text{ subject to } 0 \leq \sigma_R \leq \sigma_{R+OBU}, \quad (E.58)$$

with the noisy observation $\check{q}_{R+OBU}$ of the chosen Q values of RP+OBUP, the vector $x=[1/(\sqrt{2}\sigma_R)\ q_{0,L}\ q_{0,R}]^T$, the standard deviation of the Gaussian RP PDF, for example the variance of the Gaussian RP PDF $\sigma_R^2$, the standard deviation of the RP+OBUP PDF, for example the variance of the RP+OBUP PDF $\sigma_{R+OBU}^2$, and the matrix A that realizes two reference lines, i.e.

$$A = \begin{bmatrix} t_l & 1_{N_l} & 0_{N_l} \\ t_r & 0_{N_r} & 1_{N_r} \end{bmatrix}, \quad (E.59)$$

with the chosen low and high CDF times $t_l$ and $t_h$, respectively. $1_N$ and $0_N$ denote the one and zero vectors of length N, respectively.

Since the RP component has (or is assumed to have) an expected value of zero, the RP component is fully characterized by solving the above problem.

Thus, the standard deviation $\sigma_R$ of the RP component can be determined by solving the optimization problem of equation (E.58), i.e. by minimizing the cost functional $\|\check{q}_{R+OBU}-Ax\|_2^2$ under the side-constraint $0 \leq \sigma_R \leq \sigma_{R+OBU}$.

It is noted that the optimization problem of Equation (E.58) is convex. Thus, a local optimum automatically is a global optimum.

The recovered standard deviation $\sigma_R$ is typically overestimated, since the slope of the Q values $q_{R+OBU}$ only approaches the one from the underlying Gaussian distribution asymptotically.

Furthermore, the following Dual-Dirac value is obtained $$\delta\delta_{OBU}=\sqrt{2}\sigma_R(q_{0,L}-q_{0,R}) \quad (E.60)$$

As already mentioned above, the RP PDF $p_R$ is fully characterized by the standard deviation $\sigma_R$.

In order to obtain the OBU PDF, a deconvolution of either equation (E.52) or equation (E.53) is performed. In other words, either the RP+OBUP PDF is separated into the RP PDF and the OBUP PDF, or the RP+OBUP histogram bin probability is separated into the RP PDF and the OBUP histogram bin probability, respectively.

Both approaches yield the same type of optimization problem. In the following, the deconvolution of equation (E.52) is described without restriction of generality.

First, equation (E.55) may be used in order to obtain the RP+OBUP PDF $p_{R+OBU}$ based on the available (observed) histogram bin probabilities.

The deconvolution is then performed by minimizing the following constrained least-squares problem:

$$\min_{p_{OBU}} \|\check{p}_{R+OBU} - P_R p_{OBU}\|_2^2 + \lambda\|Bp_{OBU}\|_2^2 \text{ subject to} \quad (E.61)$$

$$p_{OBU} \geq 0$$

$$1^T p_{OBU} = \frac{1}{T}$$

$$t^T p_{OBU} = \frac{\mu_{R+OBU}}{T} \text{ (optional)}$$

$$((t-\mu_{R+OBU}) \odot (t-\mu_{R+OBU}))^T p_{OBU} = \frac{\sigma_{R+OBU}^2 - \sigma_R^2}{T} \text{ (optional)},$$

with the length-L noisy observation $\check{p}_{R+OBU}$ of the RP+OBUP PDF, the L×L Toeplitz matrix $P_R$ composed out of normalized elements of $p_{R,ext}=[0_{\lfloor L/2 \rfloor}\ p_R\ 0_{\lfloor L/2 \rfloor}]$, i.e.

$$[P_R]_{k,l}=T[p_{R,ext}]_{k-l+L-1}, \quad (E.62)$$

a regularization parameter $\lambda > 0$, and the L×L smoothing regularization matrix $$B = \frac{1}{T}\begin{bmatrix} 1 & 0 & 0 & & 0 & 0 & 0 \\ 0 & 1 & -1 & \cdots & 0 & 0 & 0 \\ 0 & 0 & 1 & & 0 & 0 & 0 \\ \vdots & & & \ddots & & & \vdots \\ 0 & 0 & 0 & & 1 & -1 & 0 \\ 0 & 0 & 0 & \cdots & 0 & 1 & -1 \\ 0 & 0 & 0 & & 0 & 0 & 1 \end{bmatrix}. \quad (E.63)$$

The length-L vector t is the time information, $\mu_{R+OBU}$ is the expected value of the RP+OBUP PDF, and $\odot$ denotes element-wise multiplication.

Thus, the OBU PDF $p_{OBU}$ can be determined by solving the optimization problem of equation (E.61), i.e. by minimizing the cost functional $\|\check{p}_{R+OBU}-P_R P_{OBU}\|_2^2+\lambda\|Bp_{OBU}\|_2^2$ under the side-constraints given in equation (E.61).

The first two side-constraints in equation (E.61) ensure that valid histogram bin probabilities are obtained based on the OBUP PDF.

The smoothing regularization ensures that a unique solution is obtained that has a certain degree of smoothness, i.e., that is slowly changing. This may be required, since high-frequency components in the RP+OBUP PDF are strongly noisy due to the low-frequency nature of the RP PDF.

The last two constraints are optional, and they allow for obtaining the anticipated values for the expected value and the variance of the OBUP PDF.

It is noted that the optimization problem of Equation (E.61) is convex. Thus, a local optimum automatically is a global optimum.

Thus, the discrete-time OBUP PDF $p_{OBU}$ can be determined via the method described above.

The discrete-time OBUP PDF $p_{OBU}$ can be used to reconstruct the bandlimited continuous-time PDF $$p_{OBU\_BL}(t) = \sum_{l=-\infty}^{+\infty} p_{OBU}[l]\text{sinc}\left(\frac{t}{T}-l\right)du. \quad (E.64)$$

Based on Error! Reference source not found., the PDF of a sum of the OBUP component and another independent perturbance component X can be obtained (X may be any other type of jitter or noise other than RJ, OBUJ, RN, and OBUN):

$$p_{X+OBU\_BL}(kT + T_0) = \int_{-\infty}^{\infty} p_X(u) p_{OBU\_BL}(kT + T_0 - u) du = \quad (E.\ 65)$$

$$\int_{-\infty}^{\infty} p_X(u) \sum_{l=-\infty}^{+\infty} p_{OBU}[l] \operatorname{sinc}\left(\frac{kT + T_0 - u}{T} - l\right) du =$$

$$\sum_{l=-\infty}^{+\infty} p_{OBU}[l] \int_{-\infty}^{\infty} p_X(u) \operatorname{sinc}\left(\frac{kT - lT + T_0 - u}{T}\right) du =$$

$$T \sum_{l=-\infty}^{+\infty} p_{OBU}[l] p_X[k - l],$$

with the discrete-time X PDF $p_X[k]$ that corresponds to the samples of the bandlimited perturbation PDF $\tilde{p}_X(kT+T_0)$:

$$p_X[k] = \tilde{p}_X(kT + T_0) = \frac{1}{T} \int_{-\infty}^{\infty} p_X(u) \operatorname{sinc}\left(\frac{kT + T_0 - u}{T}\right) du. \quad (E.\ 66)$$

Moreover, the OBUP histogram bin probability is given by $$P_{OBU_{BL}}(kT + T_0) = \int_{-\frac{T}{2}}^{\frac{T}{2}} p_{OBU_{BL}}(kT + T_0 + u) du = \quad (E.\ 67)$$

$$\sum_{l=-\infty}^{+\infty} p_{OBU}[l] \int_{-\frac{T}{2}}^{\frac{T}{2}} \operatorname{sinc}\left(k - l + \frac{T_0 + u}{T}\right) du.$$

The X+OBU histogram bin probability can be expressed as $$P_{X+OBU\_BL}(kT + T_0) = \int_{-T/2}^{T/2} p_{X+OBU\_BL}(kT + T_0 + u) du = \quad (E.\ 68)$$

$$\int_{-T/2}^{T/2} \int_{-\infty}^{\infty} p_X(kT + T_0 + u - v) p_{OBU\_BL}(v) dv du =$$

$$\int_{-\infty}^{\infty} P_X(kT + T_0 - v) \sum_{l=-\infty}^{+\infty} p_{OBU}[l] \operatorname{sinc}\left(\frac{v}{T} - l\right) dv =$$

$$\sum_{l=-\infty}^{+\infty} p_{OBU}[l] \int_{-\infty}^{\infty} P_X(v) \operatorname{sinc}\left(\frac{kT - lT + T_0 - v}{T}\right) dv, \text{ or}$$

-continued $$P_{X+OBU\_BL}(kT + T_0) = \quad (E.\ 69)$$

$$T \sum_{l=-\infty}^{+\infty} p_{OBU}[l] \int_{-T/2}^{T/2} \tilde{p}_X(kT - lT + T_0 + u) du =$$

$$T \sum_{l=-\infty}^{+\infty} p_{OBU}[l] \tilde{P}_X(kT - lT + T_0), \text{ with}$$

$$P_X(t) = \int_{-T/2}^{T/2} p_X(t + u) du \quad \tilde{P}_X(t) = \int_{-T/2}^{T/2} \tilde{p}_X(t + u) du. \quad (E.\ 70)$$

For the case of a bandlimited X PDF $$p_{X\_BL}(t) = \sum_{l=-\infty}^{+\infty} p_{X\_BL}(lT) \operatorname{sinc}\left(\frac{t}{T} - l\right), \quad (E.\ 71)$$

the following is obtained:

$$P_{X\_BL+OBU\_BL}(kT + T_0) = T \sum_{l=-\infty}^{+\infty} p_{OBU}[l] P_{X\_BL}(kT - lT + T_0), \text{ with} \quad (E.\ 72)$$

$$P_{X\_BL}(t) = \int_{-T/2}^{T/2} p_{X\_BL}(t + u) du. \quad (E.\ 73)$$

Accordingly, a histogram being associated with both the OBUP component of the input signal and an arbitrary further perturbance component other than the OBUP and the RP may be determined.

For example, a combined histogram of DDJ and OBUJ, and/or a combined histogram of DDN and OBUN may be determined. As another example, a combined histogram of PJ and OBUJ, and/or a combined histogram of PN and OBUN may be determined.

Figure 14:
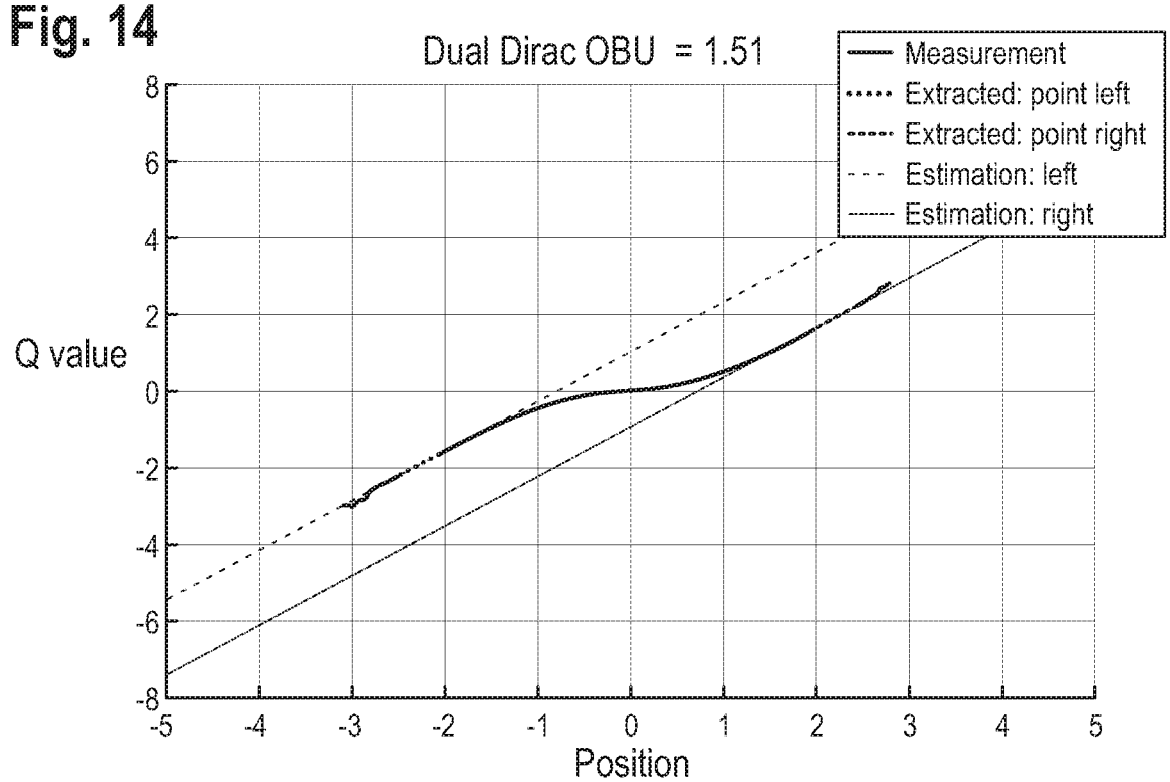
FIG. 14 shows a Q space view of a cumulative collective probability density function.
Figure 15:
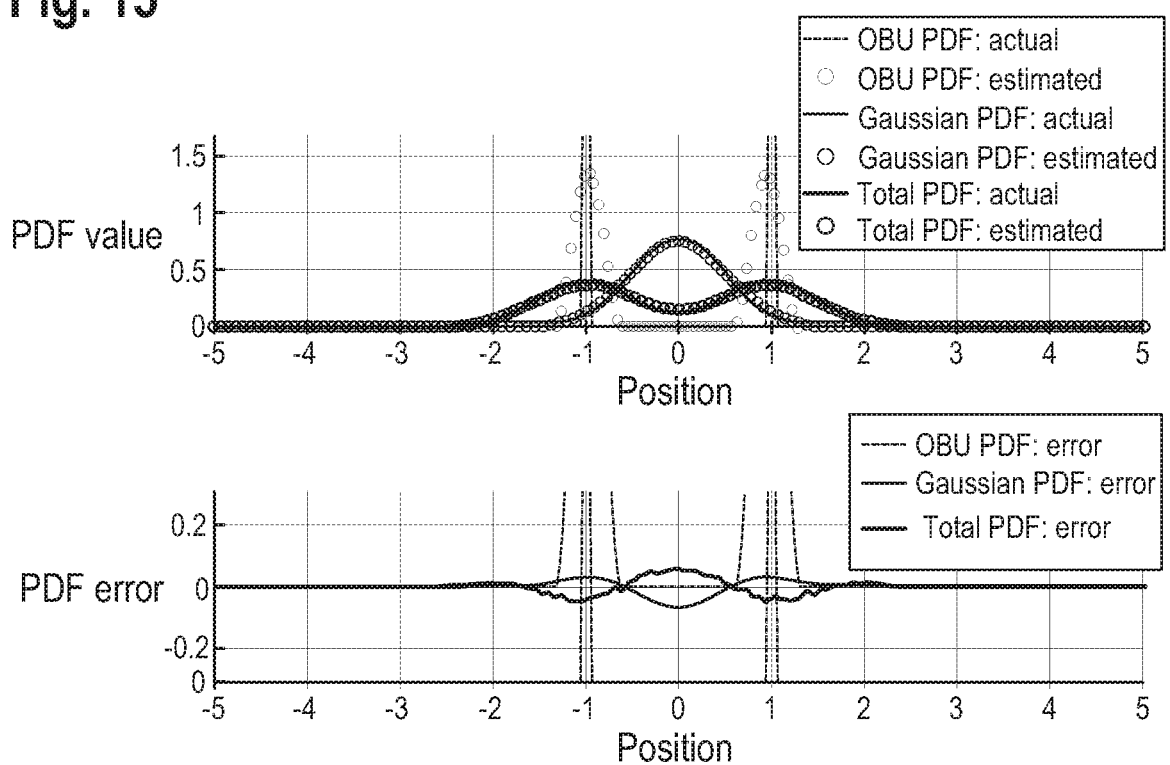
FIG. 15 shows a comparison of actual and estimated probability density functions with the respective estimation errors.

The method for separating the OBUP and the RP components of the input signal is illustrated in FIGS. 14 and 15, which show an example for the case of an OBUP PDF with two peaks of equal height at positions t=−1 and t=+1 and a zero-mean Gaussian RP PDF with standard deviation 0.5.

The RP+OBU histogram is based on $10^5$ samples. As can be seen in FIG. 14, the extracted points are located in regions that show a close to linear behavior, while they are not yet significantly affected by noise. The Dual-Dirac value $\delta\delta_{OBU}$=1.51 is clearly different from the OBUP peak separation value 2.

As can be seen in FIG. 15, the estimated RP PDF is very close to the actual one. The OBUP PDF is determined with the optional constraints in equation (E.61), and the regularization parameter λ=5e−5.

The peaks in the estimated OBUP PDF are correctly located at the positions t=−1 and t=+1, but they are smoothed out due to the regularization, which is required to ensure uniqueness of the optimization result. The reconstructed RP+OBUP PDF shows a good agreement with the actual one.

Certain embodiments disclosed herein utilize circuitry (e.g., one or more circuits) in order to implement standards, functions, models, protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation including one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method for determining at least one perturbance component of an input signal, wherein the input signal is generated by a signal source, and wherein the perturbance is associated with at least one of jitter and noise, comprising:
receiving and/or generating probability data containing information on a collective probability density function of a random perturbance component of said input signal and an other bounded uncorrelated (OBU) perturbance component of said input signal;
determining a standard deviation of said random perturbance component based on the probability data;
determining a random perturbance probability density function being associated with the random perturbance component based on the standard deviation; and
determining an OBU perturbance probability density function being associated with the OBU perturbance component, wherein the OBU perturbance probability density function is determined based on the probability data and based on the probability density function that is associated with the random perturbance component.

2. The signal analysis method of claim 1, wherein the OBU perturbance probability density function is determined by a deconvolution of the collective probability density function and the random perturbance probability density function.

3. The signal analysis method of claim 2, wherein the deconvolution is performed by at least one of minimizing and maximizing a cost functional, wherein the cost functional depends on the collective probability density function, the determined random perturbance probability density function and the OBU perturbance probability density function to be determined.

4. The signal analysis method of claim 3, wherein the cost functional is at least one of minimized and maximized by a least squares method.

5. The signal analysis method of claim 3, wherein the cost functional is minimized or maximized under at least one side-condition.

6. The signal analysis method of claim 5, wherein the at least one side-condition comprises at least one of a non-negativity of the OBU perturbance probability density function, a defined value for a summed OBU perturbance probability density function, and an unambiguity of the OBU perturbance probability density function.

7. The signal analysis method of claim 1, wherein the standard deviation is determined by a mathematical scale transformation of a cumulative collective probability density function being associated with both the random perturbance component and the OBU perturbance component.

8. The signal analysis method of claim 1, wherein the standard deviation of the random perturbance component is determined by at least one of minimizing and maximizing a cost functional, wherein the cost functional depends on a cumulative collective probability density function and the standard deviation of the random perturbance component.

9. The signal analysis method of claim 8, wherein the cost functional is at least one of minimized and maximized by a least squares method.

10. The signal analysis method of claim 8, wherein the cost functional is minimized or maximized under at least one side-condition.

11. The signal analysis method of claim 10, wherein the at least one side-condition comprises at least one of a non-negativity of the standard deviation of the random perturbance component, and an upper boundary for the standard deviation of the random perturbance component.

12. The signal analysis method of claim 1, wherein at least one histogram being associated with the OBU perturbance component and at least one further perturbance component is determined based on the determined OBU perturbance probability density function, wherein the at least one further perturbance component is different from the OBU perturbance component and from the random perturbance component.

13. The signal analysis method of claim 1, wherein said input signal is PAM-n coded, wherein n is an integer bigger than 1.

14. A measurement instrument, comprising at least one input channel and an analysis circuit being connected to the at least one input channel,
   the analysis circuit being configured to receive and/or generate probability data containing information on a collective probability density function of a random perturbance component of said input signal and an other bounded uncorrelated (OBU) perturbance component of said input signal, wherein the perturbance is associated with at least one of jitter and noise;
   the analysis circuit being configured to determine a standard deviation of said random perturbance component based on the probability data;
   the analysis circuit being configured to determine a random perturbance probability density function associated with the random perturbance component based on the standard deviation; and
   the analysis circuit being configured to determine a OBU perturbance probability density function associated with the OBU perturbance component, wherein the OBU perturbance probability density is determined by the analysis circuit based on the probability data and based on the probability density function associated with the random perturbance component.

15. The measurement instrument of claim 14, wherein the analysis circuit is configured to determine the OBU perturbance probability density function by a deconvolution of the collective probability density function and the random perturbance probability density function.

16. The measurement instrument of claim 15, wherein the analysis circuit is configured to perform the deconvolution by at least one of minimizing and maximizing a cost functional, wherein the cost functional depends on the collective probability density function, the determined random perturbance probability density function and the OBU perturbance probability density function to be determined.

17. The measurement instrument of claim 16, wherein the analysis circuit is configured to minimize or maximize the cost functional under at least one side-condition.

18. The measurement instrument of claim 14, wherein the analysis circuit is configured to determine the standard deviation of the random perturbance component by at least one of minimizing and maximizing a cost functional, wherein the cost functional depends on a cumulative collective probability density function and the standard deviation of the random perturbance component.

19. The measurement instrument of claim 18, wherein the analysis circuit is configured to minimize or maximize the cost functional under at least one side-condition.

20. The measurement instrument of claim 14, wherein the measurement instrument is established as at least one of an oscilloscope, a spectrum analyzer and a vector network analyser.

* * * * *